(12) United States Patent
Moddel

(10) Patent No.: US 11,463,026 B2
(45) Date of Patent: Oct. 4, 2022

(54) QUANTUM PLASMON FLUCTUATION DEVICES

(71) Applicant: The Regents of the University of Colorado, a body corporate, Denver, CO (US)

(72) Inventor: Garret Moddel, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 346 days.

(21) Appl. No.: 16/855,892

(22) Filed: Apr. 22, 2020

(65) Prior Publication Data

US 2020/0357997 A1 Nov. 12, 2020

Related U.S. Application Data

(60) Provisional application No. 62/904,666, filed on Sep. 23, 2019, provisional application No. 62/920,636, filed on May 10, 2019.

(51) Int. Cl.
*H02N 11/00* (2006.01)
*H01L 49/00* (2006.01)
*H01L 39/14* (2006.01)

(52) U.S. Cl.
CPC ........... *H02N 11/008* (2013.01); *H01L 39/14* (2013.01); *H01L 49/006* (2013.01); *H02N 11/002* (2013.01)

(58) Field of Classification Search
CPC .... H02N 11/002; H02N 11/008; H01L 39/14; H01L 49/006
See application file for complete search history.

(56) References Cited

U.S. PATENT DOCUMENTS

| | | | |
|---|---|---|---|
| 5,590,031 A | 12/1996 | Mead et al. | |
| 6,424,418 B2* | 7/2002 | Kawabata | G01N 21/553 356/445 |
| 6,477,028 B1 | 11/2002 | Pinto | |
| 6,593,566 B1 | 7/2003 | Pinto | |
| 6,650,527 B1 | 11/2003 | Pinto | |
| 6,665,167 B2 | 12/2003 | Pinto | |
| 6,782,179 B2* | 8/2004 | Bozhevolnyi | B82Y 20/00 385/129 |
| 6,842,326 B2 | 1/2005 | Pinto | |

(Continued)

FOREIGN PATENT DOCUMENTS

WO 00/71894 A1 11/2000

OTHER PUBLICATIONS

U.S. Appl. No. 16/855,890, filed Apr. 22, 2020.

(Continued)

*Primary Examiner* — Pedro J Cuevas
(74) *Attorney, Agent, or Firm* — Kilpatrick Townsend & Stockton LLP

(57) ABSTRACT

Described herein are devices incorporating plasmon Casimir cavities, which modify the distribution of allowable plasmon modes within the cavities. The plasmon Casimir cavities can drive charge carriers from or to an electronic device adjoining the plasmon Casimir cavity by modifying the distribution of zero-point energy-driven plasmons on one side of the electronic device to be different from the distribution of zero-point energy-driven plasmons on the other side of the electronic device. The electronic device can exhibit a structure that permits transport or capture of carriers in very short time intervals, such as in 1 picosecond or less.

37 Claims, 9 Drawing Sheets

(56) References Cited

U.S. PATENT DOCUMENTS

| | | | |
|---|---|---|---|
| 6,920,032 B2 | 7/2005 | Pinto | |
| 7,043,134 B2* | 5/2006 | Berini | G02B 6/1226 |
| | | | 385/147 |
| 7,110,154 B2* | 9/2006 | Ballato | G02F 1/353 |
| | | | 359/321 |
| 7,177,515 B2* | 2/2007 | Estes | B82Y 20/00 |
| | | | 385/130 |
| 7,184,641 B2* | 2/2007 | Karalis | G02B 6/1226 |
| | | | 385/129 |
| 7,379,286 B2 | 5/2008 | Haisch et al. | |
| 7,411,772 B1 | 8/2008 | Tymes | |
| 7,760,421 B2* | 7/2010 | Lawandy | G02F 1/353 |
| | | | 359/341.5 |
| 7,773,228 B1* | 8/2010 | Hollingsworth | G01N 21/553 |
| | | | 359/585 |
| 8,039,368 B2 | 10/2011 | Drndic | |
| 8,317,137 B2 | 11/2012 | Cormier | |
| 8,803,340 B2 | 8/2014 | Moddel | |
| 8,913,366 B1 | 12/2014 | Mezinis | |
| 9,581,142 B2 | 2/2017 | Moddel | |
| 9,634,158 B2 | 4/2017 | Kobayshi | |
| 9,983,354 B1* | 5/2018 | Ptasinski | G02B 6/1226 |
| 10,199,414 B2 | 2/2019 | Kobayshi | |
| 10,222,550 B2* | 3/2019 | Ptasinski | G02B 6/1226 |
| 10,612,971 B2 | 4/2020 | Huang | |
| 10,996,379 B2* | 5/2021 | Jornet | G02B 5/008 |
| 11,133,758 B2* | 9/2021 | Moddel | H02N 11/008 |
| 11,239,073 B2* | 2/2022 | Fuhrer | H01L 21/02532 |
| 11,251,723 B2* | 2/2022 | Moddel | H01L 33/0037 |
| 11,258,379 B2* | 2/2022 | Moddel | H02N 11/002 |
| 2003/0179974 A1* | 9/2003 | Estes | B82Y 20/00 |
| | | | 385/2 |
| 2003/0206708 A1* | 11/2003 | Estes | G02B 6/1226 |
| | | | 385/37 |
| 2005/0151973 A1* | 7/2005 | Naya | G01N 21/553 |
| | | | 356/445 |
| 2006/0027709 A1 | 2/2006 | Pinto | |
| 2007/0007393 A1 | 1/2007 | Pinto | |
| 2007/0116420 A1* | 5/2007 | Estes | G02B 6/10 |
| | | | 385/130 |
| 2007/0241470 A1 | 10/2007 | Haisch et al. | |
| 2007/0273959 A1* | 11/2007 | Lawandy | G02F 1/353 |
| | | | 359/333 |
| 2008/0296437 A1 | 12/2008 | Cormier | |
| 2009/0322221 A1 | 12/2009 | Makansi | |
| 2010/0142259 A1 | 6/2010 | Drndic | |
| 2010/0237198 A1 | 9/2010 | Cormier | |
| 2012/0212375 A1* | 8/2012 | Depree, IV | H01Q 15/0086 |
| | | | 977/762 |
| 2013/0283797 A1 | 10/2013 | Bressi | |
| 2014/0092520 A1 | 4/2014 | Rosendorf | |
| 2014/0092521 A1 | 4/2014 | Rosendorf | |
| 2014/0158887 A1 | 6/2014 | Rosendorf | |
| 2014/0158906 A1 | 6/2014 | Rosendorf | |
| 2014/0353577 A1 | 12/2014 | Agarwal | |
| 2014/0374865 A1 | 12/2014 | Kobayashi | |
| 2017/0199078 A1 | 7/2017 | Huang | |
| 2017/0338355 A1 | 11/2017 | Kobayashi et al. | |
| 2018/0059704 A1 | 3/2018 | Villalobos | |
| 2019/0139760 A1* | 5/2019 | Fuhrer | H01L 21/02381 |
| 2019/0207537 A1 | 7/2019 | Bressi | |
| 2020/0011978 A1 | 1/2020 | Chu | |
| 2020/0357997 A1 | 11/2020 | Moddell | |
| 2020/0358375 A1 | 11/2020 | Moddell | |
| 2020/0358376 A1* | 11/2020 | Moddel | H02N 11/002 |
| 2020/0395872 A1* | 12/2020 | Moddel | C25B 9/50 |
| 2022/0006399 A1* | 1/2022 | Moddel | H02N 11/002 |
| 2022/0098477 A1* | 3/2022 | May | H01L 51/0085 |

OTHER PUBLICATIONS

U.S. Appl. No. 16/855,897, filed Apr. 22, 2020.
U.S. Appl. No. 16/870,860, filed May 8, 2020.
International Search Report and Written Opinion dated Sep. 22, 2020 in application No. PCT/US2020/032251, all pgs.
Visser, et al.: II Follow Up: "What is the 'Zero-Point Energy' (or 'vacuum energy 1 ) in Quantum Physics? Is it Really Possible That We Could Harness This Energy?" 11, Scientific American, Aug. 18, 1997 (Aug. 18, 1997), XP055728009.
Dmitriyeva, et. al.,:"Test of Zero-point Energy Emission from Gases Flowing Through Casimir Cavities", Physics Procedia, x A vol. 38, Nov. 8, 2012 (Nov. 8, 2012), pp. 8-17, XP028514995, ISSN: 1875~3892, DOI: 10.1016/J.PHPR0.2012.08.007.
International Search Report and Written Opinion dated Nov. 5, 2020 in application No. PCT/IB2020/054256, all pgs.
Francesco Intravaia, et al.: "Strong Casimir Force Reduction Through Metallic Surface Nanostructuring", Nature Communications, vol. 4, No. 1, Sep. 27, 2013 (Sep. 27, 2013).
Atar,et. al., 2013, "Plasmonically Enhanced Hot Electron Based Photovoltaic Device," ,Optics Express 21:6, 7196-7201.
Blandford and Thorne, 2008, "Applications of Classical Physics," Lecture Notes Chapter 6, California Institute of Technology, Version 12.
Brongersma, et. al., (Eds.), 2007, "Surface Plasmon Nanophotonics", (vol. 131); Springer.
Brongersma, 2015, "Plasmon-Induced Hot Carrier Science and Technology", Nature Nanotechnology, 10:1,25-34.
Chalabi, et al., 2014, "Hot-Electron Photodetection with a Plasmonic Nanostripe Antenna," Nano Lett., 14:3, 1374-1380.
Clavero, 2014, "Plasmon Induced Hot-Electron Generation at Nanoparticle/Metal-Oxide Interfaces for Photovoltaic and Photocatalytic Devices," Nature Photonics, 8:2, 95-103.
Cowell, William E., et al., "Barrier Height Estimation of Asymmetric Metal-lnsulator-Metal-Tunneling Diodes", J. Appl. Phys., 114:213703, (2013).
Du,et. al., 2013, "Ultrafast Plasmon Induced Electron Injection Mechanism in Gold-Ti02 Nanoparticle System." J. Photochem. and Photobiol. C: Photochem. Revs., 15, 21-30.
Gall, 2016, "Electron Mean Free Path in Elemental Metals," J. Appl. Phys., 119:8, 085101.
Genet, et. al., 2003, "Casimir Force and the Quantum Theory of Lossy Optical Cavities," Phys. Rev. A, 67:4, 043811.
Gong, et al., 2007, "Design of Plasmonic Cavities for Solid-State Cavity Quantum Electrodynamics Applications," Appl. Phys. Lett., 90:3, 033113. (abstract only).
Grover, S., et al., "Metal Single-Insulator and Multi-Insulator Diodes for Rectenna Solar Cells", 21 pgs.
Helman, et. al., 1973, "Theory of Internal Photoemission," Phys. Rev. B, 7:8, 3702.
Herner, et. al., 2017, "High Performance MIIM Diode Based on Cobalt Oxide/Titanium Oxide," Appl. Phys. Lett., 110, 223901.
Jiang, et al., 2017, "Photoelectrochemical Devices for Solar Water Splitting-Materials and Challenges,", Chem. Soc. Rev., 46:15, 4645-4660.
John, et. al., 2017, "Optical Properties of Graphene, Silicene, Germanene, and Stanine from IR to Far UV—a First Principles Study," J. Phys. and Chem. of Solids, 110, 307-315. (abstract only).
Kish, 2005, "Stealth Communication: Zero-Power Classical Communication, Zeroquantum Quantum Communication and Environmental-Noise Communication," Appl. Phys. Lett.,87:23, 234109.
Kish, et al., 2016, "Zero-Point Term and Quantum Effects in the Johnson Noise of Resistors: a Critical Appraisal," J. Stat. Mech.: Theory and Experiment, 2016:5, 054006.
Knight, et. al., 2013, "Embedding Plasmonic Nanostructure Diodes Enhances Hot Electron Emission," Nano Lett., 13:4, 1687-1692. (abstract only).
Kodama, et. al., 2001, "Fast Heating of Ultrahigh-Density Plasma as a Step Towards Laser Fusion Ignition," Nature, 412:6849, 798.
Lambe, et. al., 1976, "Light Emission From Inelastic Electron Tunneling," Phys. Rev.Lett., 37:14, 923.
Lebedev et al., 1999, "The dynamics of wire array Z-pinch implosions," Phys. of Plasmas, 6:5, 2016-2022. (abstract only).
Li, Rengui, 2017, "Latest Progress in Hydrogen Production from Solar Water Splitting Via Photocatalysis, Photoelectrochemical, and

(56) References Cited

OTHER PUBLICATIONS

Photovoltaic-Photoelectrochemical Solutions,", Chinese Journal of Catalysis, 38:1,5-12. (abstract only).

McCarthy, et. al., 1977, "Enhancement of Light Emission from Metal-Insulator-Metal Tunnel Junctions," Appl. Phys. Lett., 30:8, 427-429.

Mizuguchi, et. al., 2007, "Simulation of High-Energy Proton Production by Fast Magnetosonic Shock Waves in Pinched Plasma Discharges," Phys. of Plasmas, 14:3, 032704.

Moddel, G. and Dmitriyeva, 0., 2019, "Extraction of Zero-Point Energy from the Vacuum: Assessment of Stochastic Electrodynamics-Based Approach as Compared to Other Methods," Atoms, 7(2), 51.

Moddel, G., "Will Rectenna Solar Cells Be Practical?", 22 pgs. (2013).

Ozawa, et al., 2007, "Preparation and Characterization of the Eu3+ Doped Perovskite Nanosheet Phosphor: Lao.90Euo.osNb207," Chemistry of Materials, 19:26, 6575-6580.

Sze, et al., 2006, "Physics of Semiconductor Devices," John Wiley & Sons, p. 682.

Van Dorp, et. al., 2009, "SiC: a Photocathode for Water Splitting and Hydrogen Storage," Angewandte Chemie Intl. Ed., 48:33, 6085-6088.

Viswanath, e.t al., 2019, "A Nanosheet Phosphor of Double-Layered Perovskite with Unusual Intrananosheet Site Activator Concentration," Chem. Eng. J., 122044.

Wang, et. al., 2000, "Light Emission From the Double-Barrier Al/Ah03/Al/Ah03/Au Tunnel Junction," Thin Solid Films, 371:1-2, 191-194.

Wang, et. al., 2011, "Plasmonic Energy Collection Through Hot Carrier Extraction," Nano Lett., 11: 12, 5426-5430. (abstract only).

Wang, et. al., 2017, "Field-Assisted Splitting of Pure Water Based on Deep-Sub-Debyelength Nanogap Electrochemical Cells," ACS Nano, 11:8, 8421-8428.

Walter, et. al., 2010, "Solar Water Splitting Cells," Chem. Rev. 110: 11, 6446-6473.

Yam, P., "Exploiting Zero-Point Energy", Scientific American, Scientific American, Inc., New York, NY, US, vol. 277, No. 6, Dec. 1, 1997 (Dec. 1, 1997) pp. 54-57.

Zhu, 2014, "Graphene Geometric Diodes for Optical Rectennas," PhD Thesis, University of Colorado, 68-77.

Zhu, et. al., 2019, "Graphene Geometric Diodes for Terahertz Rectennas", J. Phys. D: Appl. Phys., 46, 185101.

International Search Report and Written Opinion dated Jul. 31, 2020 in related application No. PCT/IB2020/054254, all pgs.

International Search Report and Written Opinion dated Aug. 3, 2020 in related application No. PCT/IB2020/054255, all pgs.

* cited by examiner

US 11,463,026 B2

QUANTUM PLASMON FLUCTUATION DEVICES

CROSS REFERENCE TO RELATED APPLICATIONS

This application claims the benefit of and priority to U.S. Provisional Application No. 62/904,666, filed on Sep. 23, 2019, and U.S. Provisional Application No. 62/920,636, filed on May 10, 2019, which are hereby incorporated by reference in their entireties.

FIELD

This invention is in the field of electronic devices. This invention relates generally to quantum devices for harvesting and generating electrical energy.

BACKGROUND

According to quantum theory the quantum vacuum is filled with electromagnetic radiation in the form of quantum vacuum fluctuations and materials are also filled with quantum fluctuations of charge density and other oscillations. There has been substantial discussion about whether this energy can be harvested, and if so, how. A chief problem in harvesting this energy is that it forms the energy ground state, and so it does not flow from one region to another. However, the quantum vacuum energy is geometry-dependent, and its density is lower in a Casimir cavity than in free space. The use of Casimir cavities therefore opens the possibility of making use of the quantum vacuum fluctuations to drive energy from one location to another.

SUMMARY

Devices for generation of electrical energy are described herein. In embodiments, devices described herein use two different regions in which the distribution of quantum plasmon fluctuations is different to drive energy across an electronic device such that a portion of it can be harvested.

In an aspect, devices are disclosed for generation and capture of charge carriers that are excited by quantum plasmon fluctuations. Devices of this aspect may use an asymmetry in quantum plasmon modes with respect to a transport layer to drive a flow of energy or particles or waves across the transport layer, such as between conductors positioned on opposite sides of the transport layer. Devices of this aspect may also or alternatively comprise a structure permitting fast transport and/or capture of a charge carrier, such as in 1 ps or less. In some embodiments, a device of this aspect may be referred to as a plasmon injector or a plasmon injector device.

An example device of this aspect may comprise a zero-point-energy-density-reducing structure, a device component, and a transport layer. The transport layer may be positioned between and adjoining the zero-point-energy-density-reducing structure and the device component. The zero-point-energy-density-reducing structure can advantageously provide an asymmetry with respect to the transport layer that drives a flow of energy between the zero-point-energy-density-reducing structure and the device component. For example, the asymmetry can produce a net charge flow between the zero-point-energy-density-reducing structure and the device component. The devices disclosed herein are distinguished from solar cells, photodiodes, or other devices that convert light from an external illumination source into an electrical current and are capable of producing a flow of energy that occurs even in the absence of external sources of illumination. Stated another way, the disclosed devices are capable of producing power whether in dark conditions or in light conditions. The asymmetry described above may provide a difference between a first zero-point energy density on a first side of the transport layer, such as within the zero-point-energy-density-reducing structure, and a second zero-point energy density on a second side of the transport layer, such as within the device component, that drives the flow of energy. A load may be positioned to receive electric current from the zero-point-energy-density-reducing structure and the device component, such as an electric current driven by the difference in zero-point energy densities.

The zero-point-energy-density-reducing structure of the devices of this aspect may comprise a conductor, structured to limit a range of zero-point energy plasmon modes within the conductor. Such a structured conductor may be referred to herein as a plasmon Casimir cavity. For example, the conductor may include a metasurface, optionally exemplified as a set of spatially periodic structures characterized by a pitch. The metasurface may serve, at least in part, as a reflector for plasmons, and limit the plasmon modes supported within the conductor. In another example, the conductor comprises a series of alternating sublayers of at least two different conductors.

The devices of this aspect may comprise or correspond to an electronic device. For example, the zero-point-energy-density-reducing structure may correspond to at least a part of a first conductive layer of an electronic device, while the device component may correspond to at least a part of a second conductive layer of the electronic device. In specific examples, the electronic device is a conductor/insulator/conductor device or a Schottky diode, though other device structures may also be used.

In some examples, the zero-point-energy-density-reducing structure comprises a first conductor, structured to limit a range of zero-point energy plasmon modes within the first conductor and the device component comprises a second conductor, such as a second conductor that does not comprise a structure that limits of zero-point energy plasmon modes within the second conductor. In this way, an asymmetry is created across the transport layer that can drive a flow of energy between the first conductor and the second conductor, as described above.

Another device of this aspect can comprise nanoparticles pairs in which zero-point energy densities are different to drive a flow of energy. For example, such a device may incorporate a Casimir cavity as the zero-point-energy-density-reducing structure and a first nanoparticle at least partially within the Casimir cavity. The device component in this example may comprise a second nanoparticle electrically coupled to the first nanoparticle. The second nanoparticle may be positioned outside of the Casimir cavity. The transport layer in this example may comprise a portion of the second nanoparticle. Zero-point energy excited plasmons can drive a flow of charges between the second nanoparticle and the first nanoparticle. Useful nanoparticle pairs include, but are not limited to, those where the first nanoparticle comprises a conductor, and where the second nanoparticle comprises a semiconductor.

In another aspect, device arrays are disclosed. An example device array may comprise a plurality of devices, such as any of those described above or elsewhere in this disclosure, arranged in an array configuration. For example, the plurality of devices may be arranged in a combination of series and parallel configurations.

In another aspect, device stacks are disclosed. An example device stack may comprise a plurality of device layers arranged in a stacked configuration. Each device layer may comprise one or more of the devices described above or elsewhere in this disclosure. Optionally, each device layer may comprise a device array.

In another aspect, plasmon Casimir cavities are disclosed. In some examples, a plasmon Casimir cavity comprises a conductor structured to limit a range of zero-point energy plasmon modes within the conductor. For example, the conductor may optionally be structured by a metasurface, such as a metasurface that exhibits spatially periodic structures characterized by a pitch. In another example, the conductor comprises a series of alternating sublayers that include at least one conductor. Optionally, the thicknesses of the alternating sublayers can all be the same or they can all be different or some can be the same while some are different. Optionally, a dielectric or a semiconductor comprises at least a part of one sublayer.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

DETAILED DESCRIPTION

Quantum vacuum fluctuations fill all space with electromagnetic radiation. The energy density of this radiation in free space is $$\rho(hf) = \frac{8\pi f^2}{c^3}\left(\frac{hf}{\exp(hf/kT)-1} + \frac{hf}{2}\right) \quad \text{Eq. 1}$$

where h is Planck's constant, f is the frequency of the radiation, c is the speed of light, k is Boltzmann's constant, and T is the temperature. The first term in brackets in Eq. 1 is due to thermal blackbody radiation at non-zero temperatures, and the second term is temperature independent and corresponds to the quantum vacuum radiation.

Figure 1:
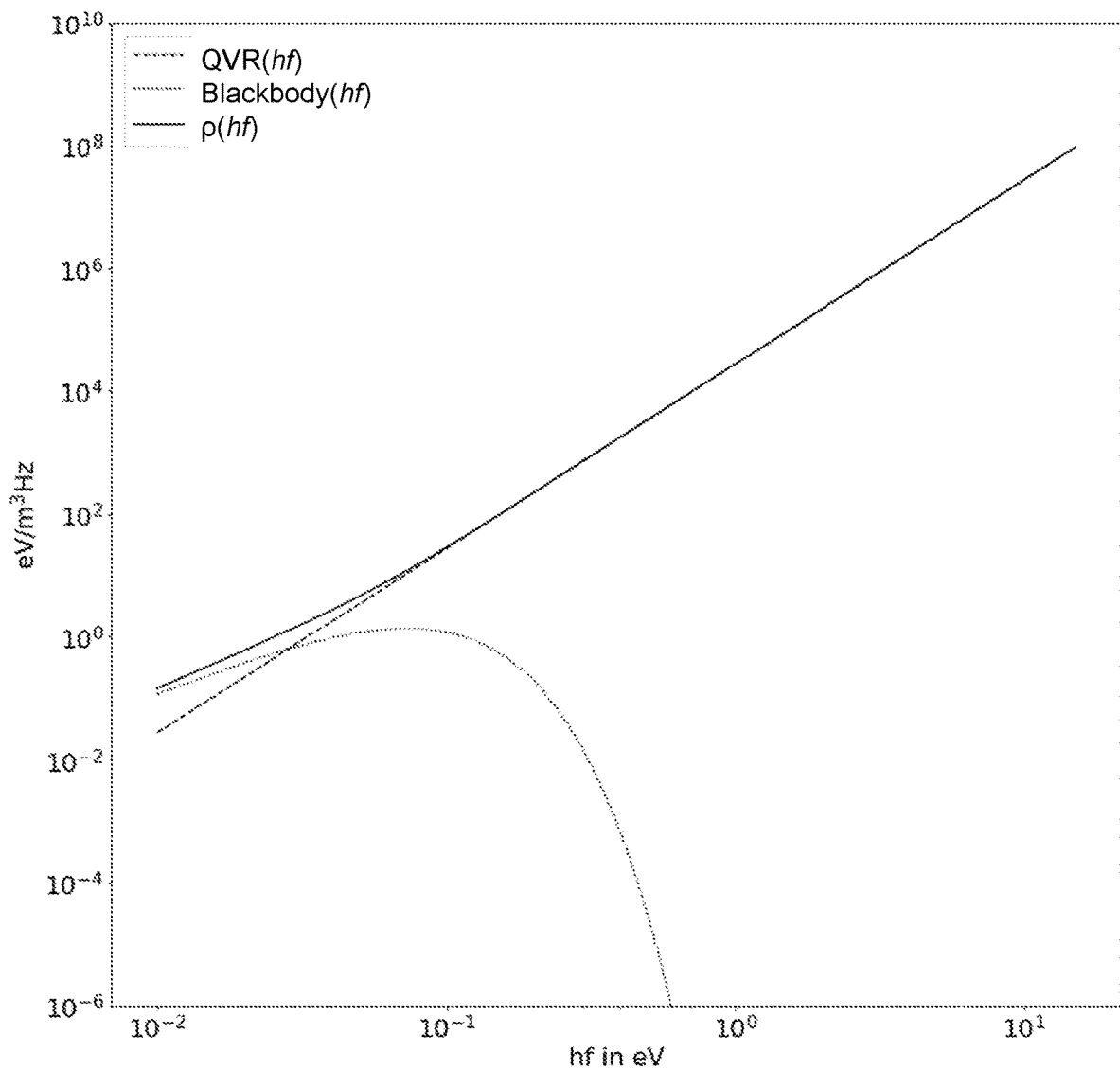
FIG. 1 provides a plot showing energy density spectra for quantum vacuum radiation and blackbody radiation.

The energy density ($\rho(hf)$) spectrum for both the temperature dependent term and the temperature independent term in Eq. 1 is shown in FIG. 1, where the data is plotted as a function of photon energy, hf, where h is Planck's constant and f is optical frequency, which varies with the reciprocal of the wavelength. At 300 K, the thermal component (labeled Blackbody(hf) in FIG. 1) reaches its maximum in the infrared through visible parts of the spectrum, whereas the quantum vacuum radiation (labeled QVR(hf) in FIG. 1) component grows with the frequency cubed and becomes much larger than the thermal component of the spectrum at visible light frequencies and beyond (as shown in Eq. 1, above). For 300 K blackbody radiation, the quantum vacuum radiation component exceeds the thermal part for any frequencies above 7 THz, corresponding to a photon energy of approximately 29 meV. Because the energy density of the quantum vacuum radiation part of the spectrum at high frequencies is much larger than that of the thermal spectrum, much more power may be available from the quantum vacuum radiation.

Harvesting energy arising out of the quantum vacuum radiation does not appear to violate any physical laws, but because the energy corresponds to that of the ground-state, there is generally no driver for the energy to flow. However, the quantum vacuum radiation is geometry dependent, and its density can be different in different regions of space. For example, a zero-point-energy-density-reducing structure can establish a geometric condition where the zero-point energy density in one region of space can be lower than in free space, such as outside the structure, which, therefore, provides a difference and a condition for energy flow to occur. One approach is described in U.S. Pat. No. 7,379,286, which is hereby incorporated by reference.

Figure 2:
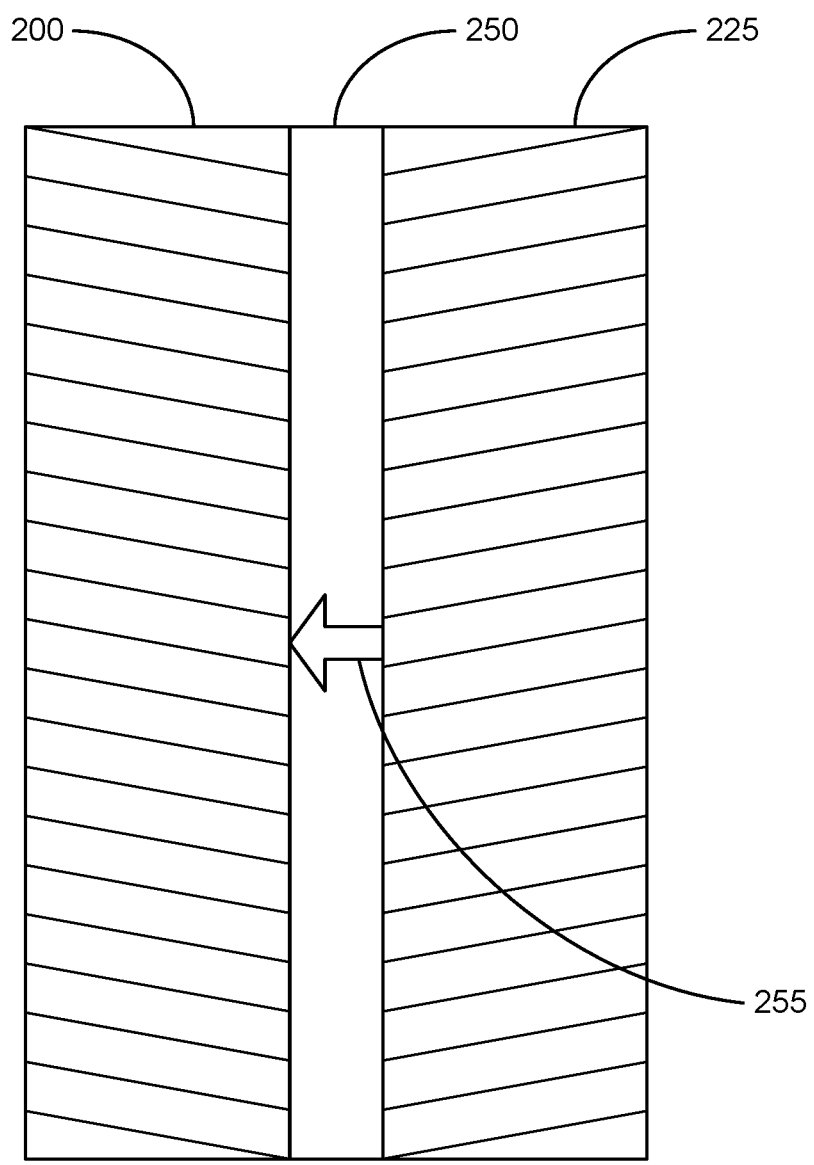
FIG. 2 provides a schematic illustration of an example device driven by an energy density difference, in accordance with at least some embodiments.

To be able to make use of a difference in zero-point energy densities, an asymmetry with respect to a zero-point-energy-density-reducing structure may be used, allowing a portion of the energy to be harvested. As shown in FIG. 2, a zero-point-energy-density-reducing structure 200 can be used to establish an asymmetry in zero-point energy densities between one side of a transport medium 250 and the other, such as by having one side of the transport medium 250 adjacent to, and energetically constrained by, the zero-point-energy-density-reducing structure 200 and the other side adjoining device component 225, which is unconstrained by the zero-point-energy-density-reducing structure 200. By using a structure for producing an asymmetry in the zero-point energy density on one side of the device with respect to the other, and a structure for transport (e.g., the transport medium 250) of energy or waves or charge, a net power across the transport medium from the device component 225 that has no zero-point-energy-density-reducing structure, and hence has a higher zero-point energy level, to the side with the zero-point-energy-density-reducing structure 200, which has a lower zero point energy density, can flow across the transport medium 250, as schematically shown by arrow 255. The same concept applies if both sides have zero-point-energy-density-reducing structures, but having different critical dimensions or frequency cutoffs.

Another way to look at an asymmetry requirement is in terms of equilibrium and detailed balance. In equilibrium, the flow of energy from any first element to any second element must be balanced by an equal energy flow from the second element to the first element. This results from a detailed balance. A zero-point-energy-density-reducing structure can facilitate a means to break this balance, so that there is a smaller flow of energy from the side of a device with the zero-point-energy-density-reducing structure than from the side of a device without it.

One example of a zero-point-energy-density reducing structure is a Casimir cavity, which can be formed using two closely-spaced, parallel reflecting plates. As a result of the requirement that the tangential electric field must vanish (for an ideal reflector) at the boundaries, limits are placed on which quantum vacuum modes (i.e., field patterns) are allowed between the plates. In general, the modes allowed include those where the gap spacing is equal to an integer multiple of half of the wavelength. Modes having wavelengths longer than twice the gap spacing are largely excluded. This results in the full spectrum of quantum vacuum modes exterior to the plates, described by Eq. 1, being larger and more numerous than the constrained set of modes in the interior, and thus there is a lower energy density in the interior. The critical dimension, which determines the wavelength above which quantum vacuum modes are suppressed, is the gap spacing (for the case of a one dimensional Casimir cavity). Casimir cavities can also be constructed in the form of cylinders (nanopores), in which case the critical dimension is the diameter. Casimir cavities may be formed having other geometries as well.

Quantum vacuum radiation is one type of zero-point energy that exists in free space and transparent media. Zero-point energy-driven modes exist in media beside free space, and in waves besides electromagnetic waves. Other waves include phonons, polaritons including plasmons, plasma oscillations, and electromagnetic waves in matter, spin waves, and acoustic waves. Only high frequency waves that carry sufficient energy are of interest for harvesting, similar to the condition for quantum vacuum radiation shown in FIG. 1. For each of these waves supporting zero-point energy-driven modes, the energy can be extracted if a spatial gradient in the zero-point energy magnitude can be provided, similar to the way a Casimir cavity can create a spatial difference in zero-point energy densities in the form of quantum vacuum radiation.

Plasmons are charge oscillations and include surface plasmons and volume or bulk plasmons. Surface plasmons can exist at interfaces between conductors, plasmas, or charged gases, and dielectrics, such as insulators, semiconductors, and air. Bulk or volume plasmons are longitudinal charge oscillations inside conductors, plasmas, or charged gases, and generally have a higher energy and frequency than surface plasmons. The term plasmon is used herein to refer to both surface and bulk plasmons, and other infrared through ultraviolet light frequency polaritons in materials. Plasmons in conductors, including metals, or at conductor interfaces can support waves having frequencies of interest, and therefore cavities that suppress a range of plasmon modes can provide the sort of asymmetry needed for zero-point energy harvesting and can be used as zero-point-energy-density reducing structures.

Plasmon Casimir Cavities. In contrast to a Casimir cavity, where zero-point energy electromagnetic oscillations in vacuum or transparent media are suppressed, a cavity in which zero-point energy plasmon oscillations are suppressed is referred to herein as a plasmon Casimir cavity. Plasmon Casimir cavities can be used as another type of zero-point-energy-density reducing structure.

A plasmon Casimir cavity can be formed by structuring a conductive medium in a way that limits the zero-point energy plasmon modes that are supported by the medium. This can be accomplished, for example, by incorporating a periodic structure having a pitch that suppresses a band of zero-point energy plasmons. Plasmon wavelengths of twice the pitch are reflected, and longer wavelengths are largely suppressed. This results in the full spectrum of zero-point energy modes exterior to the plasmon Casimir cavity being larger and more numerous than the constrained set of modes in the interior, and thus there is a lower energy density in the interior.

One way to produce such a periodic structure is with use of a distributed Bragg reflector. Such a reflector can be formed using metamaterials and metasurfaces, and can suppress a range of plasmonic modes in a conductor, similar to the way that a Casimir cavity suppresses a range of electromagnetic modes. In that way it forms a Casimir cavity for plasmons. The plasmon Casimir cavity can be used in specific structures to provide an asymmetry in zero-point energy density, as described below.

Figure 3A:
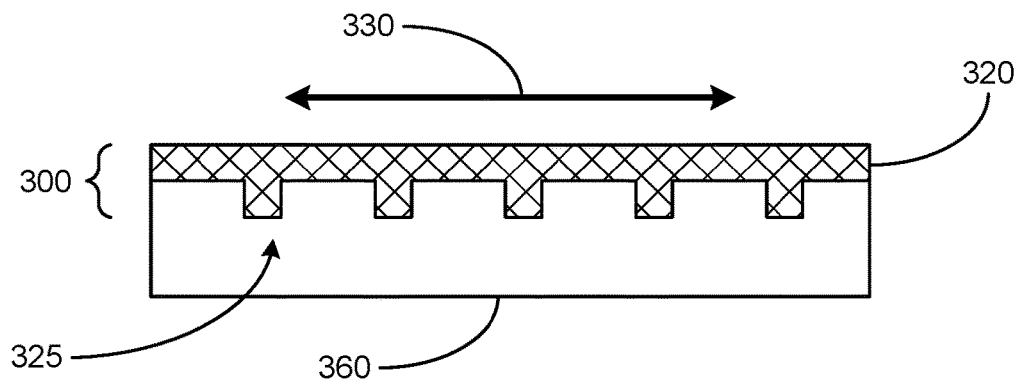
FIG. 3A and FIG. 3B provide cross-sectional illustrations of example plasmon Casimir cavities, in accordance with some embodiments.

FIG. 3A provides a schematic illustration of an example plasmon Casimir cavity 300 including a distributed Bragg reflector type metasurface 325 in a conductor 320. Metasurface 325 limits the plasmon spectrum in the conductor 320 and can correspond to periodic protrusions of the conductor 320 that extend into a dielectric 360 supporting the conductor 320, and can suppress plasmon modes in the horizontal direction in FIG. 3A, as shown by arrow 330. Metasurface 325 may comprise any structure that interacts with plasma oscillations within the conductor and may be constructed as spatially periodic set of structured regions in the conductor 320, as shown. In some examples, metasurface 325 may comprise a series of raised regions, recessed regions, ridges, grooves, corrugations, or the like. The metasurface may extend to the edge of the structure but does not have to and can stop at some distance before the edge. Plasmons modes tend to have smaller wavelengths for a given frequency than free-space optical modes, and so the pitch must be small to suppress zero-point energy modes of interest. The pitch may be in the range of 5 nm to 500 nm, for example, and may depend on the wavelength and energy of interest. Conductor 320 may comprise a metal, such as silver, gold, copper, aluminum, nickel, graphene, or other materials that support plasmons. It will be appreciated that other surface or interface structures incorporating conductors known to those skilled in the art may also be used to restrict the plasmon spectrum and provide a plasmon Casimir cavity.

Figure 3B:
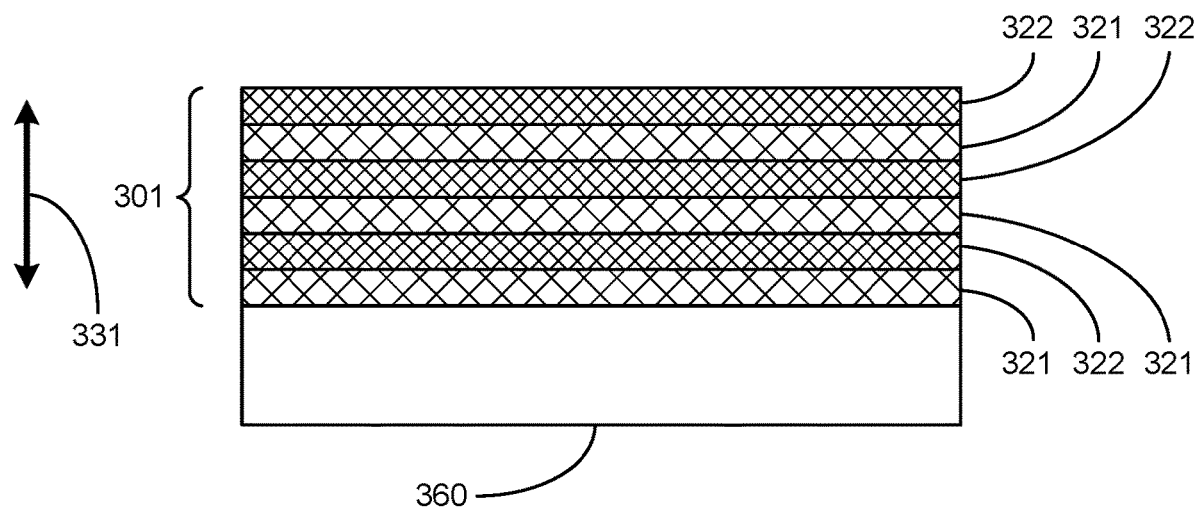

A different configuration that can be used to form a plasmon Casimir cavity is a distributed Bragg reflector type multilayer stack, as schematically illustrated in FIG. 3B. Plasmon Casimir cavity 301 is analogous to a dielectric stack reflector that is used to form an optical mirror, but is instead formed from layers of conductors 321 and 322 to form a plasmon reflector, which can be used to suppress plasmon modes in the vertical direction, as shown by arrow 331. The configuration shown in FIG. 3B incorporates two types of conductors 321 and 322 that differ in their plasmonic properties, such as free electron density, electron mass, electron mobility, Fermi level or morphology. At high frequencies where the conductors become transparent, usually in the ultraviolet, the two types of conductors differ in index of refraction. Conductors 321 and 322 are formed as an alternating stack in which the thickness of each pair of layers characterizes the pitch. Plasmon wavelengths of twice the pitch are reflected, and longer wavelengths are largely suppressed. The layer thicknesses may further be chirped to enhance the spectral width of the reflections. Optionally, a very thin dielectric or semiconductor (e.g., comprising $SiO_2$, $Al_2O_3$, NiO, $Nb_2O_5$, $Ta_2O_5$, CrO, a-Si:H (hydrogenated amorphous silicon), or $TiO_2$), such as having a thickness between 0.2 and 20 nm, can substitute for an individual conductor layer 321 or 322 or can be incorporated into an individual conductor layer 321 or 322 to supplement the plasmon reflection characteristics. The suppression results in the full spectrum of zero-point energy modes exterior to the plasmon Casimir cavity being larger and more numerous than the constrained set of modes in the interior, and thus there is a lower energy density in the interior. One example is alternating conductor layers of Ag (electron density of $6 \times 10^{22}$ $cm^{-2}$) and Al (electron density of $18 \times 10^{22}$ $cm^{-2}$) in which each layer is 50 nm thick, to provide a pitch of 100 nm. If each pair of alternating layers is 100 nm thick, ten pairs of such alternating layers would be 1 µm thick. Any suitable number of alternating layers of conductors 321 and 322 can be used, such as from 2 layers to 100 layers, or more. As an example, FIG. 3B shows 3 pairs. It will be appreciated that other multilayer structures incorporating conductors known to those skilled in the art may also be used to restrict the plasmon spectrum and provide a plasmon Casimir cavity.

The plasmon Casimir cavity 300 making use of a structured metasurface, or corrugations, is most effective for suppressing surface plasmons, while the multilayer stack plasmon Casimir cavity 301 is most effective for suppressing volume (or bulk) plasmons. However, both plasmon Casimir cavities will suppress wavelength bands of both surface and volume plasmons. Other forms of periodic structures formed from conducting media can also perform that function.

Figure 4:
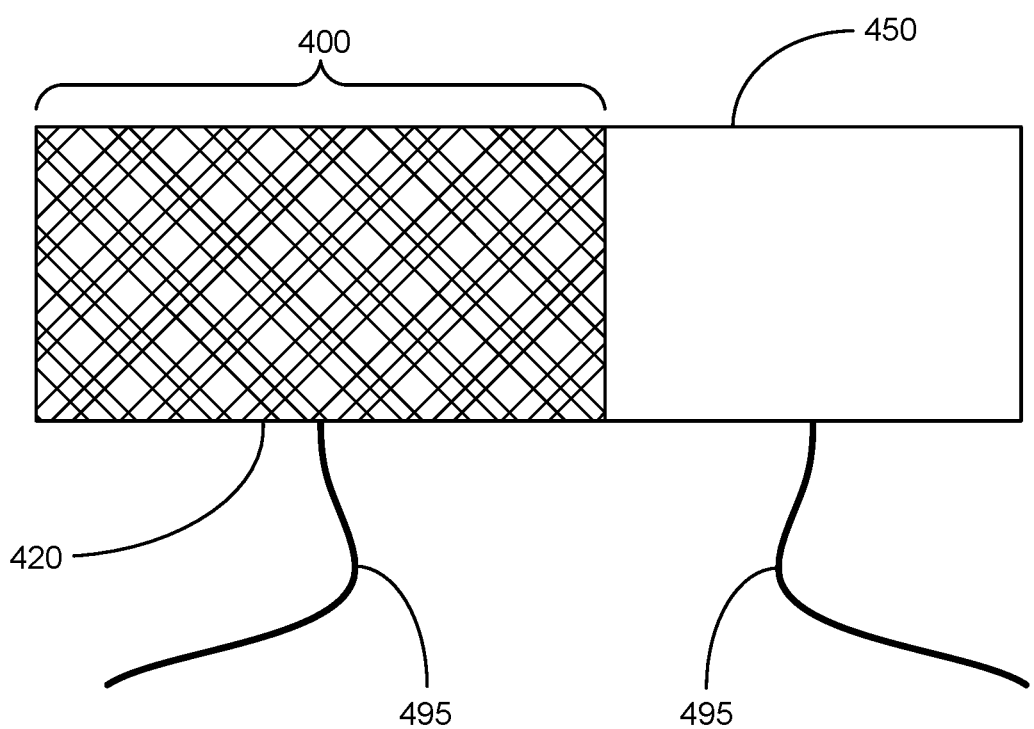
FIG. 4 provides a cross-sectional illustration of an example plasmon Casimir cavity adjacent to an example electronic device, in accordance with some embodiments.

Since plasmon Casimir cavities can suppress a range of plasmon modes, they can provide the sort of asymmetry needed for zero-point energy harvesting. FIG. 4 provides a schematic illustration of an example plasmon Casimir cavity 400 shown adjacent to a region 450 in which the plasmon mode density is not suppressed, or is suppressed less. Region 450 includes a means for transporting energy or charge or waves, and may comprise or correspond to an electronic device or a portion thereof. Plasmon Casimir cavity 400 generally comprises at least one conductive material 420. Plasmon Casimir cavity 400 may correspond to any suitable plasmon Casimir cavity, including those described above, for limiting zero-point energy plasmon modes, such as by including a metasurface or metamaterial in a conductive material, or a stack of alternating conductors.

In FIG. 4, region 450 is positioned adjacent to the plasmon Casimir cavity 400 such that one side of the region 450 is adjacent to and energetically constrained by the plasmon Casimir cavity 400, establishing an asymmetry. Region 450 can comprise an electric device adjoining plasmon Casimir cavity 400, for example. Region 450 may include material that permits transmission of charge carriers, which can be used in a process of harvesting energy via the difference in zero-point energy densities established by the presence of the plasmon Casimir cavity 400. Electrical leads 495 can be connected to the conductive material 420 and region 450 to provide captured energy, such as in the form of hot electrons or tunneling electrons, to an external load.

It will be appreciated that, although aspects described herein may be explained by reference to electrons as charge carriers, other charge carriers may be substituted for electrons for various implementations and operations of the disclosed devices, systems, techniques, and methods. Example charge carriers include, but are not limited to, electrons, holes, Cooper pairs, any charged species, or magnetic fluxes, such as used in the field of spintronics.

To harvest or capture energy in the form of a charge carrier, the charge carrier will need to be transported away from the point at which it is launched and captured. Transport and capture of the charge carrier may need to performed at very fast time scales. For example, the transport and/or capture may occur in a time interval of less than or about 1 ps, less than or about 100 fs, less than or about 10 fs, less than or about 1 fs, or less than or about 0.1 fs. In some cases, the longer the time is, the smaller the fraction of energy available will be captured. Description of fast transport and capture of charge carriers is described in further detail below.

Plasmon Injector. Plasmons within a conductor can transfer energy to charge carriers in the conductor so that they become excited, producing hot carriers. When the conductor is adjacent to a thin insulator, herein called a transport medium or transport layer, which is adjacent to a second conductor, the hot carriers can traverse the transport layer and enter the second conductor. In addition, plasmons can induce carrier tunneling through a transport layer.

Figure 5A:
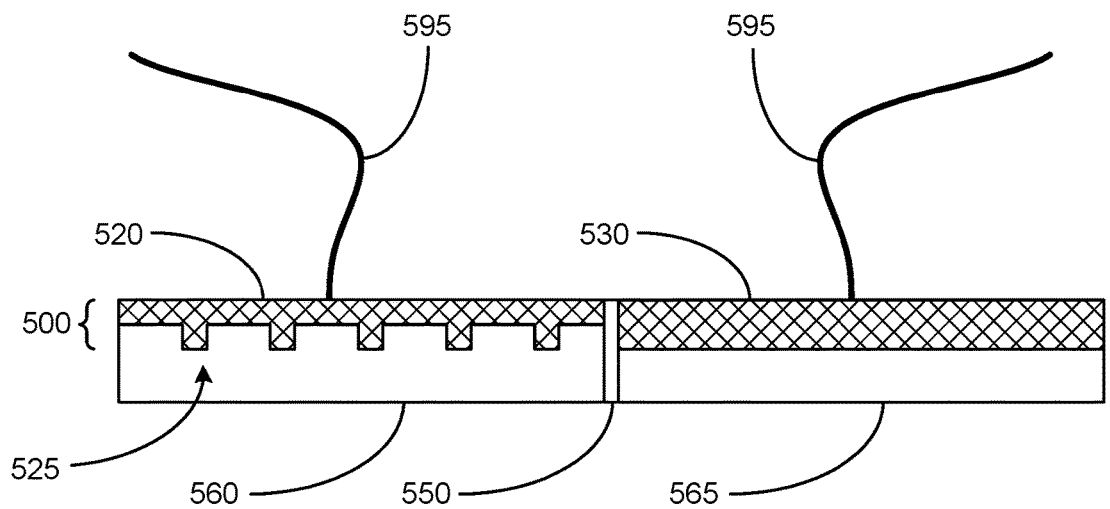
FIG. 5A and FIG. 5B provide cross-sectional illustrations of example plasmon injector devices, in accordance with some embodiments.

An example of a device that can make use of a difference in the flux of plasmon excited charge carriers in two directions for harvesting energy is a plasmon injector. A schematic cross-sectional illustration of an example plasmon injector is provided in FIG. 5A. The plasmon injector in FIG. 5A comprises a conductor/transport layer/conductor device including a plasmon Casimir cavity 500 as the first conductor 520, a transport layer 550 adjacent to and in contact with the first conductor 520, and a second conductor 530 adjacent to and in contact with the transport layer 550. Transport layer 550 is positioned between the first conductor 520 and the second conductor 530. Plasmon Casimir cavity 500 can correspond a configuration where the first conductor 520 has a metasurface 525 that limits the plasmon spectrum in the first conductor 520, as illustrated in FIG. 5A, though other plasmon Casimir cavity configurations can be used.

Metasurface 525 can correspond to periodic protrusions of first conductor 520 that extend into a first dielectric 560 supporting the first conductor. The periodic protrusions can be repeated all the way toward the side of first conductor 520 adjacent to the transport layer 550, as shown in FIG. 5A; in some cases, however, the periodic protrusions can stop in first conductor 520 at some distance from the transport layer 550. Although metasurface 525 is shown at an interface between first conductor 520 and first dielectric 560, in some cases, metasurface 525 can be on the other side (e.g., the top side) of first conductor 520, opposite the interface between first conductor 520 and first dielectric 560.

Second conductor 530 is shown supported by second dielectric 565, which may comprise the same or a different dielectric as first dielectric 560. In some configurations, transport layer 550 does not extend all the way down between first dielectric 560 and second dielectric 565. For example, transport layer 550 may only separate first conductor 520 and second conductor 530 in some cases, allowing first dielectric 560 and second dielectric 565 to comprise a unitary structure underlying first conductor 520, second conductor 530, and transport layer 550. In some configurations, first dielectric 560, second dielectric 565, and transport layer 550 all comprise the same material and optionally correspond to a contiguous unitary structure, supporting and between first conductor 520 and second conductor 530.

Figure 5B:
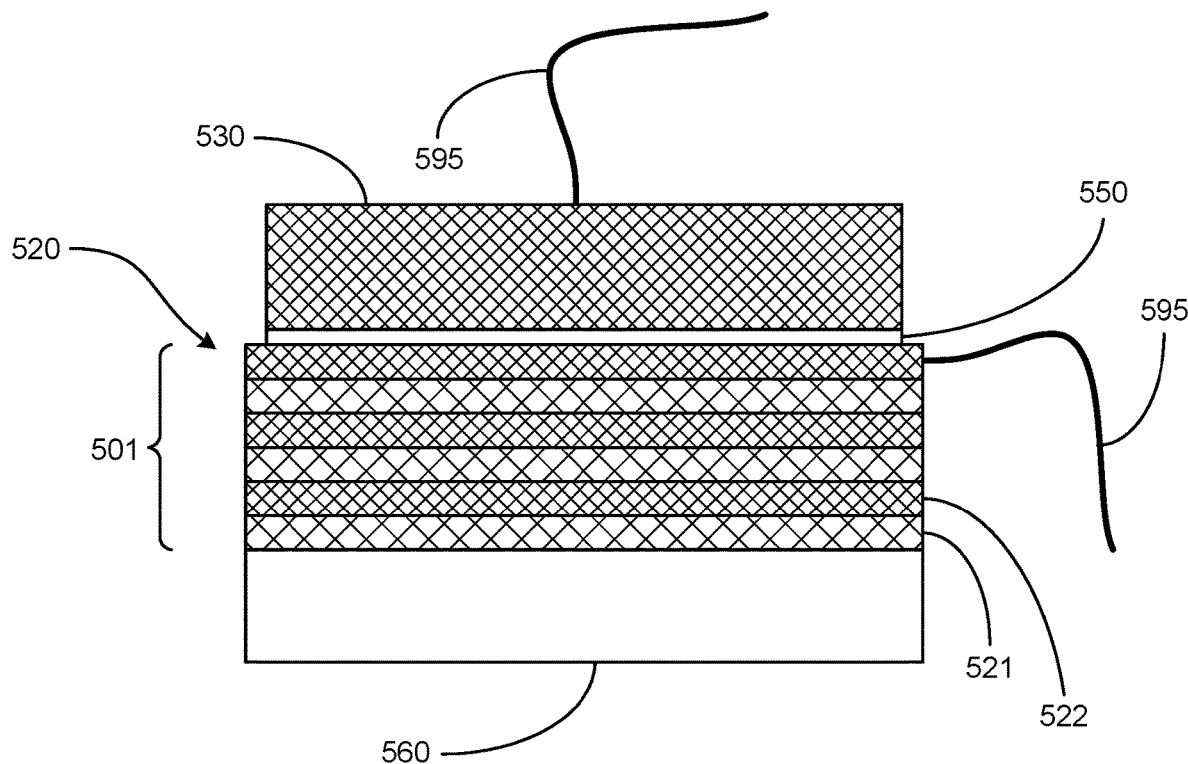

A schematic cross-sectional illustration of another example plasmon injector is provided in FIG. 5B. The plasmon injector in FIG. 5B again comprises a conductor/transport layer/conductor device including a plasmon Casimir cavity 501 as the first conductor 520, a transport layer 550 adjacent to and in contact with plasmon Casimir cavity 501, and a second conductor 530 adjacent to and in contact with transport layer 550. Transport layer 550 is positioned between the plasmon Casimir Cavity 501 and the second conductor 530. Plasmon Casimir cavity 501 is depicted in FIG. 5B as a multilayer conductor stack, with alternating layers of one conductor 521 and another conductor 522, but can also be formed with other structures that restrict the plasmon spectrum, such as those described above.

The orientation of plasmon Casimir cavity 501, second conductor 530, and transport layer 550 shown in FIG. 5B is not intended to be limiting, but may correspond to one way for orienting these components relative to a supporting dielectric and may allow for a simplified fabrication, in some embodiments. Alternatively, the alternating conductors 521 and 522 can be supported by a dielectric, which can also support the transport layer 550 and second conductor 530 (e.g., to provide a horizontal orientation rather than the vertical orientation shown in FIG. 5B).

The conductor/transport layer/conductor devices shown in FIG. 5A and FIG. 5B are electronic devices adjoining the plasmon Casimir cavity 500 or 501, where the plasmon Casimir cavity 500 or 501 functions a hybrid component, corresponding to both a plasmon Casimir cavity 500 or 501 and the first conductor of the conductor/insulator/conductor device.

Example materials for the conductor of the plasmon Casimir cavity, such as first conductor 520 in FIG. 5A, or conductors 521 and 522 in FIG. 5B and/or the second conductor 530, include, but are not limited to metals, superconductors, semiconductors (e.g., low band-gap semiconductors), two-dimensional conductive materials, conductive ceramics and or other materials that support plasmons. Example metals include, but are not limited to, Ag, Pd, Pt, Au, Cu, Al, Ni, Ti, Cr, Nb, Ta, or the like. Graphene is one example of a two-dimensional semiconductor. Other useful materials include conductive ceramics. Other useful materials include molybdenum disulfide and niobium nitride. Other useful materials include graphite, nickel silicide, or other silicides. In some cases, the first conductor 520 and/or the second conductor 530 can include a multilayer structure, such as a first layer of a first metal and a second layer of a second metal, which may be different from the first metal. An example of a bilayer structure may include a layer of chromium and a layer of aluminum. As noted above, some conductor layers can optionally include a thin layer of a dielectric or a semiconductor, which can increase a resistance of the conductor layer but can also serve to enhance plasmon reflectivity.

In FIG. 5A, first conductor 520 and second conductor 530 may have different thicknesses from one another or different lateral dimensions from one another, or their thicknesses may be the same, or their lateral dimensions may be the same. In FIG. 5B, the plasmon Casimir cavity 501 and the second conductor 530 may have different overall thicknesses from one another or different lateral dimensions from one another, or their overall thicknesses may be the same, or their lateral dimensions may be the same. For example, first conductor 520 may have a thickness in the range of 3 nm to 2 µm and/or may have lateral dimensions in the range of 10 nm to 5 cm, while second conductor 530 may have dimensions within the same ranges. Plasmon Casimir cavity 301 may have similar lateral dimensions, and the overall thickness of plasmon Casimir cavity 301 may depend upon the number of alternating layers of conductors 521 and 522 and the thickness of each conductor 521 and 522, which may have thicknesses of from 0.3 nm to 1 µm for example.

Example materials for transport layer 550, include, but are not limited to, dielectrics or some semiconductors. Example dielectrics can include oxide dielectrics or nitride dielectrics, such as aluminum oxide, aluminum nitride, silicon oxide, silicon nitride, nickel oxide, titanium oxide, niobium oxide, and other insulating metal oxides or metal nitrides. In some cases, ceramic, glass, or plastic dielectrics may be used. An example of a suitable semiconductor is hydrogenated amorphous silicon. In some cases, transport layer 550 can include a multilayer structure, such as a first layer of a first insulator and a second layer of a second insulator, which may be different from the first insulator. An example of a bilayer structure may include a layer of nickel oxide and a layer of aluminum oxide. Transport layer 550 may have a thickness along a direction between the plasmon Casimir cavity 500 or 501 and the second conductor 530 of from 0.3 nm to 50 nm, for example.

As noted above, plasmon Casimir cavities 500 or 501 limit the plasmon spectrum therein, but second conductor 530 has no limiting metasurface and so the full spectrum of surface plasmon modes that the second conductor 530 can support are allowed. In the plasmon Casimir cavity 500 or 501, carriers can be excited into the hot carrier state by zero-point energy-driven plasmon modes, and these hot carriers can enter the transport layer 550, and also carriers can tunnel from the first conductor 520 through the transport layer 550 to the second conductor 530. In the second conductor 530, a similar situation exists, where carriers can be excited into the hot carrier state by zero-point energy-driven plasmon modes, and also carriers can tunnel from the second conductor 530 through the transport layer 550 to the first conductor 520. Under equilibrium conditions in the absence of a plasmon Casimir cavity configuration, the carrier current from a first conductor on one side of a transport layer must be exactly the same as the carrier current from a second conductor on the opposite side of transport layer. On the other hand, with the configuration of a plasmon Casimir cavity 500 or 501, the supported zero-point energy-driven plasmon modes therein are reduced. Hence, the generation rate of hot carriers from plasmon Casimir cavity 500 or 501 is reduced, and also the density of plasmons available to induce tunneling from first conductor 520 is reduced. This upsets the balance in the current of carriers between the plasmon Casimir cavity 500 or 501 and the second conductor 530, such that a there is a net current of carriers (e.g., electron current) from the second conductor 530 to the first conductor 520. Because the carriers are usually electrons, which carry a negative charge, the conventional positively-charged current flows from the plasmon Casimir cavity 500 or 501 to the second conductor 530.

The plasmon injector is a DC (direct current) device, in which differing average currents originating from plasmon Casimir cavity 500 or 501 and second conductor 530 produce a voltage between them. The plasmon injector may be connected directly to a load via electrical leads 595 connected to plasmon Casimir cavity 500 or 501 and second conductor 530.

Regarding the time interval for how quickly energy from the zero-point energy driven plasmon fluctuations must be extracted before it is returned to its source or is cancelled by an opposite-energy pulse, and becomes unavailable, this time interval may be governed by a tradeoff in the amount of energy that is available to be extracted from the zero-point field, $\Delta E$, and time interval that is available for extraction, $\Delta t$. This results in a $\Delta E \Delta t \leq$ constant so that the larger the energy to be extracted, the shorter the time that it is available. If that constant is equal to h/2, where h is Planck's constant divided by $2\pi$, then, based on this relationship, harvesting the energy of a photon of 2 eV ($\Delta E$), would indicate that $\Delta t \leq 0.16$ fs. Since hot electron transport across a thin insulating layer and tunneling through it can occur in times that approach 1 fs, under this condition the transport process can be used to extract at least a fraction of the zero-point energy-excited charge carriers.

One advantage of the use of plasmon injectors relates to the injection efficiency of the zero-point energy driven plasmon excited charge carriers into the transport layer, which can be higher than a comparable injection efficiency from a free space Casimir cavity based photoinjector system. The reason is that, in a free space Casimir cavity based photoinjector system, photons must be absorbed in the first conductor, which is an inefficient process. In contrast, in a plasmon Casimir cavity system, the plasmons exist in the first conductor and do not need to be absorbed to excite charge carriers. However, this advantage may be offset, in part, by a limit on the plasmon frequencies that a conductor, such as a metal, will support, which may be lower than the optical modes supported by a free space Casimir cavity, though the supported plasmon frequencies are still sufficient for substantial energy extraction. Further, lithographic resolution may impose some constraints, as fine lithography may be needed to pattern the fine structure for a plasmon Casimir cavity. The resolution required for the systems described herein, however, are well within the limits of what current technology can provide. In some cases, nanoimprint technology can be used to pattern the fine structure for a plasmon Casimir cavity, for example.

Schottky Diode-Based Plasmon Injectors. Other structures that support charge transport from plasmon generated carriers can be used in a plasmon injector in place of the conductor/transport layer/conductor arrangement described above. These include Schottky diodes, and metal/insulator/semiconductor (MIS) diodes, Mott diodes, quantum well diodes, carbon nanotube diodes, superconductor/insulator/superconductor (SIS) devices, and other structures that facilitate the injection of charge as known to those skilled in the art. An example of another plasmon injector device comprising a Schottky diode is schematically illustrated in FIG. 6, but it will be appreciated that the other structures described may be substituted for the Schottky diode.

Figure 6:
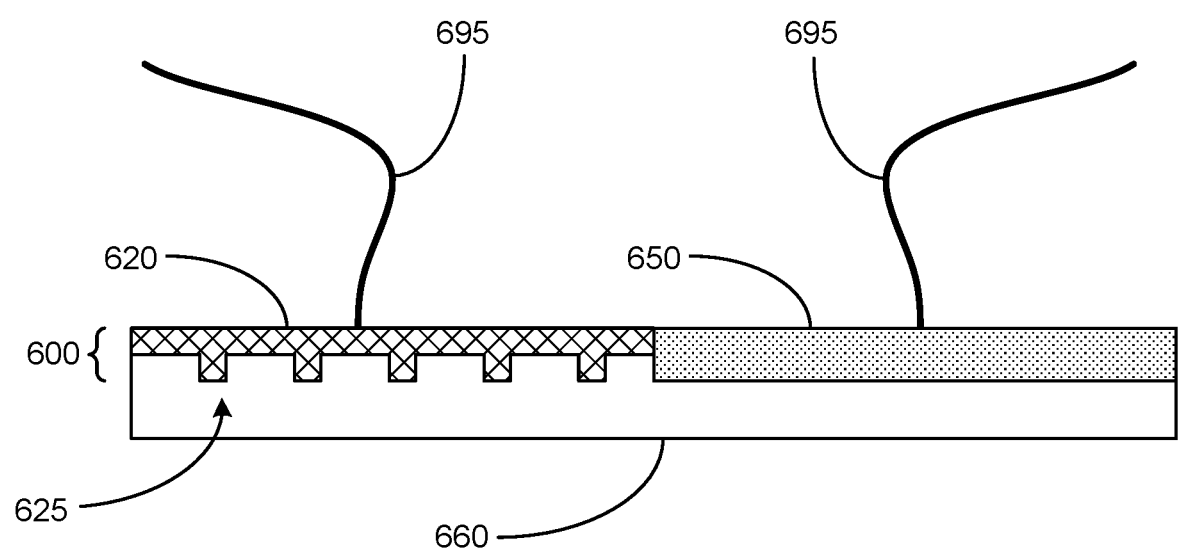
FIG. 6 provides a cross-sectional illustration of another example plasmon injector device, in accordance with some embodiments.

In FIG. 6, a plasmon Casimir cavity 600 is shown, comprising a conductor having a metasurface 625, but other plasmon Casimir cavity configurations described herein can be used. Metasurface 625 limits the plasmon spectrum in the conductor 620. Metasurface 625 can correspond to periodic protrusions of conductor 620 that extend into a dielectric 660. Although metasurface 625 is shown at an interface between conductor 620 and dielectric 660, in some cases, metasurface 625 can be at an opposite side of conductor 620. A semiconductor 650 is shown adjacent to and in contact with conductor 620.

Contact between conductor 620 and semiconductor 650 provides a junction with a band structure that is different from the band structure of the conductor/transport layer/conductor structures described above. Instead of being transported directly from a first conductor through a transport layer to a second conductor, in the Schottky diode-based plasmon injector, the hot carriers are transported from conductor 620 through an accumulation layer or depletion layer and into the bulk of semiconductor 650, where the hot carriers can be captured. Electrical leads 695 can be connected to conductor 620 and semiconductor 650 to extract the net flow of electrons for use by an external load.

The transport distance, and hence transport time, for a Schottky-diode can be larger than for the case of the conductor/transport layer/conductor structures described herein. Because of the longer transport time, the fraction of hot carriers that are captured and collected can be diminished. A shorter accumulation or depletion width may result in a quicker capture time. To reduce the width of the accumulation or depletion layer, the semiconductor may be doped heavily, for example, such as with a dopant concentration of from $10^{15}$ cm$^{-3}$ to $10^{21}$ cm$^{-3}$, or a subrange thereof. In some cases, a thin semiconductor region between conductive layers, which is a variation on a Schottky barrier called a thin Mott barrier, can be used to reduce the transport distance. Both of these methods of reducing the transport distance can reduce the transport time and hence increase the fraction of hot carriers that are captured and collected.

Figure 7:
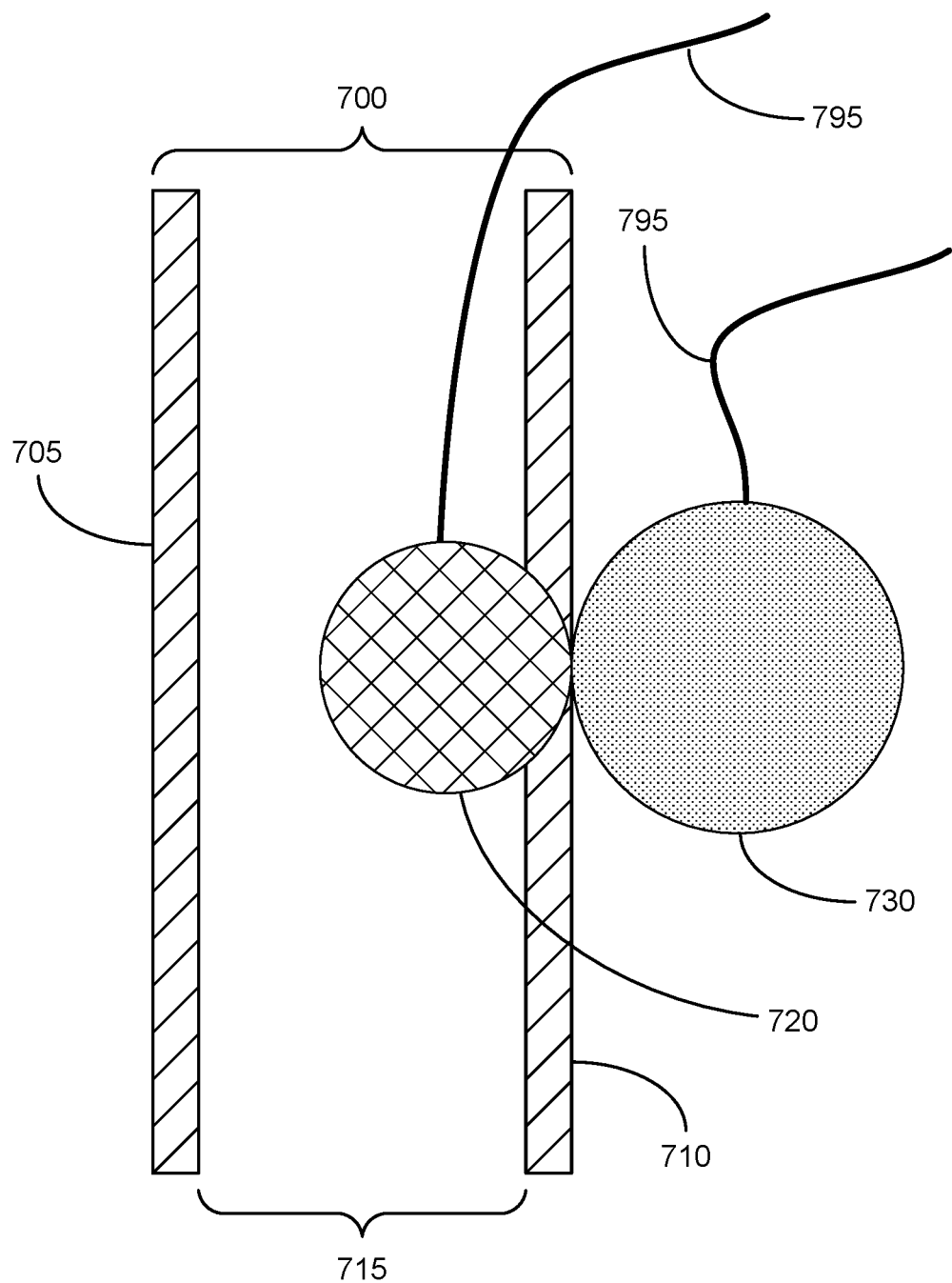
FIG. 7 provides a cross-sectional illustration of an example plasmon injector device incorporating nanoparticles, in accordance with some embodiments.

Plasmon-Driven Asymmetric Charge Carrier Injection in Nanoparticles. Energy from plasmons can also be extracted via the asymmetric injection of electrons in a nanoparticle system. An example of a system using the asymmetric injection of electrons via plasmons is shown in FIG. 7. In this system, a Casimir cavity 700 is used to restrict the distribution of quantum vacuum modes that a first nanoparticle 720 is subjected to, while a second nanoparticle 730 is not subjected to a restriction in the distribution of quantum vacuum modes.

Casimir cavity 700 comprises a first reflector 705, a second reflector 710, and a gap 715 between the first reflector 705 and the second reflector 710. Gap 715 (also referred to herein as a cavity layer) may be an empty gap (e.g., evacuated or corresponding to a vacuum) or filled with a gas, which may be achieved with rigid substrates and spacers, or filled with an at least partially transparent optical material for at least some wavelengths of electromagnetic radiation, such as condensed-phase material (e.g., a solid, liquid, or liquid crystal). Example materials useful as a cavity layer include, but are not limited to, silicon oxide or aluminum oxide. Alternatively, it may be sufficient or desirable to fill the gap with a polymer such as PMMA (polymethyl methacrylate), polyimide, polymethyl methacrylate, or silicone, which can provide adequate transparency at wavelengths of interest. In some examples, the material of a cavity layer, such as those materials described above, may have a transmittance of greater than 20% for at least some wavelengths of electromagnetic radiation from 100 nm to 10 µm. Advantageously, the material of a cavity layer may have a transmittance of greater than 50% for at least some wavelengths of electromagnetic radiation from 100 nm to 10 µm. In some cases, the material of the cavity layer, including at least some of the materials described above, may have a transmittance of greater than 70% or greater than 90% for at least some wavelengths of electromagnetic radiation from 100 nm to 10 µm. The thickness or spacing of gap 715 can be set by the target wavelength range for the Casimir cavity. In some examples, the gap 715 of a Casimir cavity can have a spacing of from 10 nm to 2 µm.

The reflector material for first reflector 705 and/or second reflector 710 can be chosen based upon its reflectivity over the wavelength range of interest, ease of deposition, and/or other considerations, such as cost. The reflector thickness must be sufficient to provide adequate reflectivity, but not so thick as to be difficult to pattern. In some examples, a reflector can have a thickness of at least 10 nm, such as from 10 nm to 1 cm. Example materials useful as a reflector of a Casimir cavity include, but are not limited to, metals, dielectric reflectors, or diffractive reflectors, such as Bragg reflectors or metamaterial reflectors. Example metals useful for a reflector of a Casimir cavity include, but are not limited to, Al, Ag, Au, Cu, Pd, or Pt. Example dielectrics useful for a dielectric reflector include, but are not limited to $ZrO_2$, $SiO_2$, $Si_3N_4$, $Nb_2O_5$, $TiO_2$, $MgF_2$, LiF, $Na_3AlF_6$, $Ta_2O_5$, $LaTiO_3$, $HfO_2$, ZnS, ZnSe, or the like. Example reflectivity for at least one of the two reflectors of a Casimir cavity is from 50% to 100% for at least some wavelengths of electromagnetic radiation from 100 nm to 10 µm. The reflectors of a Casimir cavity do not have to be metals or dielectric reflectors, and instead a reflective interface may be used. For example, the reflective layer can be a step in the index of refraction at an interface between two adjacent materials, such as between the cavity layer and its surrounding material. In some cases the cavity walls can provide a step in dielectric constant or index of refraction on transitioning from one dielectric material to another one or more, or between a dielectric material and free space.

In this system, nonequilibrium photons absorbed by the first nanoparticle can produce plasmons that induce injection of electrons from the first nanoparticle 720 to the second nanoparticle 730, as described by Du et al., Journal of Photochemistry and Photobiology C: Photochemistry Reviews, 15, 21-30, 2013, hereby incorporated by reference. In equilibrium and in the absence of Casimir cavity 700, a detailed balance shows a flow electrons from the first nanoparticle 720 to the second nanoparticle 730 is balanced by an equal flow of electrons from the second nanoparticle 730 to the first nanoparticle 720, with the result that there is no net flow of charge.

With the introduction of the Casimir cavity 700 surrounding the first nanoparticle 720, as shown in FIG. 7, or adjoining it, there is a net deficit of quantum vacuum modes impinging on the first nanoparticle 720. The result is a net flow of electrons from the second nanoparticle 730 because the distribution of quantum vacuum modes that the second nanoparticle 730 is subjected to is not restricted. The net flow of electrons may be captured to provide electrical power by electrical leads 795. The electron injection efficiency of this system can be as high as 50%, for example.

In some examples, first nanoparticle 720 may comprise a conductor. Useful conductors include many metals, such as gold, for example. In some examples, second nanoparticle 730 may comprise a semiconductor. Useful semiconductors may comprise some metal oxides, such as titanium dioxide, for example. First nanoparticle 720 may have a cross-sectional dimension (e.g., a diameter) in the range of 5 nm to 50 nm. Second nanoparticle 730 may have a cross-sectional dimension (e.g., a diameter) in the range of 5 nm to 100 nm. In some cases, a plurality of second nanoparticles 730 may be used to form a layer or film external to Casimir cavity 700. In some cases, a plurality of first nanoparticles 720 may be present within or adjacent to Casimir cavity 700, though it may be desirable to limit the relative quantity of first nanoparticles 720 such that only a single first nanoparticle 720 is in contact with any second nanoparticle 730.

Figure 8:
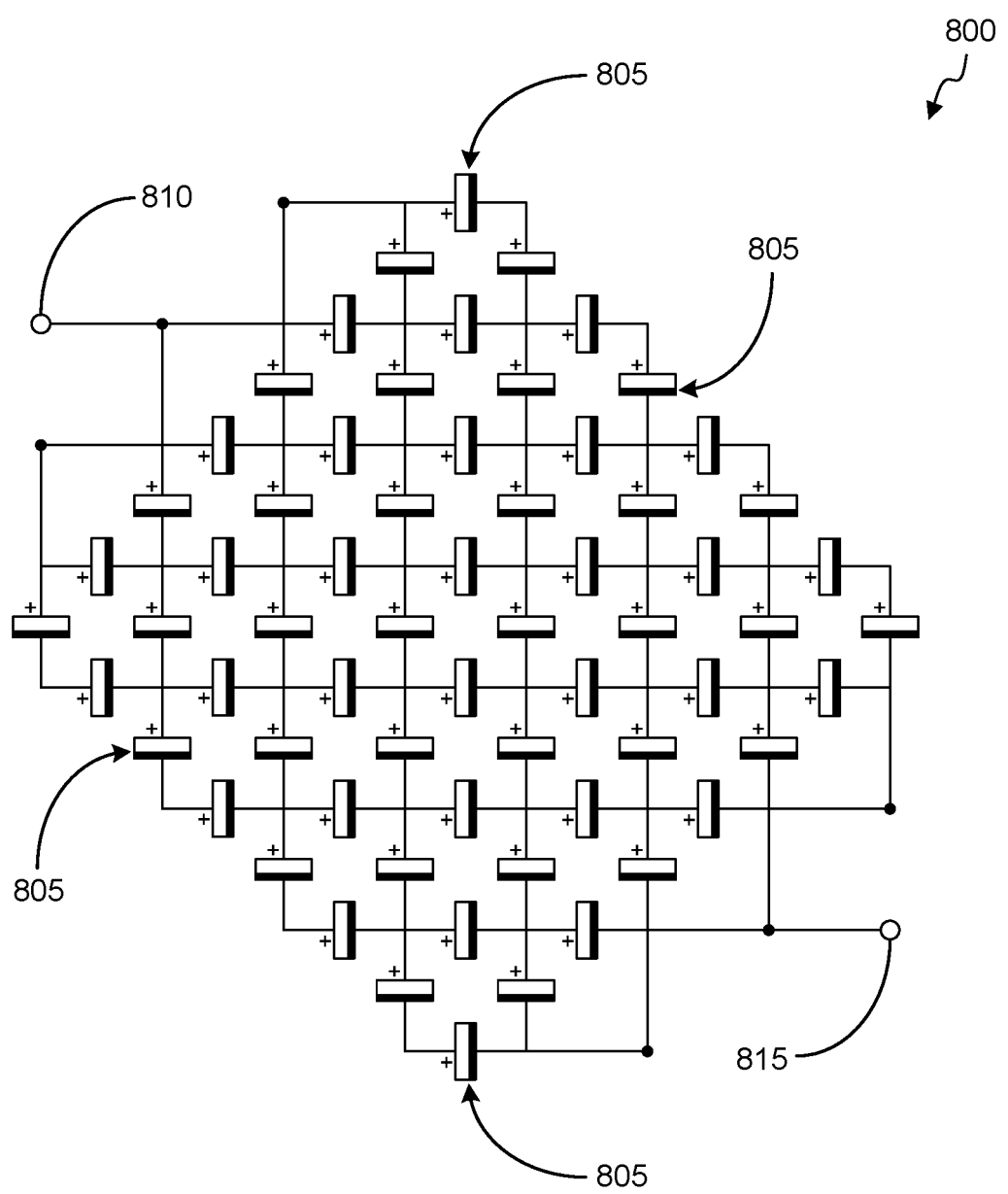
FIG. 8 provides a schematic circuit diagram of an example device array, in accordance with some embodiments.

Device Arrays. To achieve large power output, multiple devices can be configured into an array, such that the power from each device is added to provide a higher total power output from the array. An example array 800 is schematically illustrated in FIG. 8. Array 800 is illustrated as an array of individual devices 805 connected in a series and parallel combination, with two output electrodes 810 and 815. Each device 805 in FIG. 8 represents any suitable device, such as those depicted in FIGS. 5A, 5B, 6, and 7. A load is not shown in FIG. 8 but may be connected between electrodes 810 and 815. The load can correspond to any suitable electrical device, such as, and without limit, a battery, a motor, a light, an electrolysis system to produce chemical fuel, a communication device, a computer, a circuit component, or any combination thereof.

In the 64-device array shown, the DC output voltage between electrodes 810 and 815 is the sum of voltages along a series path between the output electrodes. In this case, there are 8 devices 805 in series, and so if each device provides 0.25 V at its maximum power point, the total output voltage is 2 V, for example. The current is proportional to the number of devices 805 in parallel. In this case, there are 8 devices in parallel. For example, if each device 805 produces 400 nA at its maximum power point, the total output current is 3.2 µA. The total power output in this configuration is calculated (using P=IV) as 2 V×3.2 µA or 6.4 µW.

It will be appreciated that these values are provided merely as an example and are not intended to be limiting on the output voltage or current provided by any particular device array. Further, it will be appreciated that the 64-device array with 8 devices in series and 8 devices in parallel is also an example and that other array sizes and configurations can be used. For example, linear arrays, square arrays where the number of devices in series and in parallel is the same, rectangular arrays where the number of devices in series and in parallel is different, or non-regular arrays can be used.

Although linear arrays (i.e., 1-dimensional arrays of only series arranged devices 805 or only parallel arranged devices 805) are contemplated, advantages can be obtained by using devices 805 with a series and parallel combination. For example, in the event of a short circuit across any single device 805 in array 800, the voltage between electrodes 810 and 815 is only reduced by a small amount, rather than completely (i.e., to 0 V), as would be the case in an only parallel constructed array with a short circuit across any one device. Similarly, in the event of a disconnect or broken circuit path at any single device 805 in array 800, the current between electrodes 810 and 815 is only reduced by a small amount, rather than completely (i.e., to 0 A), as would be the case in an only series constructed array with a disconnect or broken circuit path.

Each device 805 in array 800 can have any suitable dimensions and physical arrangement. As an example, the devices can be arranged in a planar configuration across an area, such as similar to that depicted in FIG. 8. In one specific example, the devices 805 can have an area of 1 µm$^2$ each (e.g., 1 µm×1 µm) and be spaced from one another with a 2 µm pitch. The interconnects between the different devices and the leads for carrying DC power out may be sufficient for operation of such an array and additional complex supporting circuitry may not be needed. For an array having a pitch of 2 µm (4 µm$^2$ total area occupied by each device 805 and accompanying space between adjacent devices), a 10 cm×10 cm array can include 2.5 billion individual devices 805. For the voltages and currents per device described above (0.25 V and 400 nA), the output of the 10 cm×10 cm array can be up to 250 W. In some cases, thermal management techniques, such as known in the art, can be used to address heat transfer and temperature control, if needed.

The devices and arrays described above have been described with reference to planar configurations. To form compact systems with further areal density, multiple layers of these devices can optionally be stacked on top of each other and separated by insulators or free space. The devices can also be formed in a nonplanar configuration. For example, the devices can be formed on the surfaces of trenches formed in a substrate or on flexible substrates that can be rolled up.

Device Fabrication. An example fabrication process according to a pattern 901 shown in FIG. 9A for a plasmon injector device 900 as schematically illustrated in cross-section in FIG. 9B is described below.

Plasmon injector device 900 is shown comprising a plasmon Casimir cavity conductor/insulator/conductor device, which comprises a first metal layer 920 including a metasurface 925, a transport layer 950, and a second metal layer 930. Pattern 901 includes a metasurface pattern 926, a first metal layer pattern 921, and a second metal layer pattern 931. For the specific fabrication scheme described below, transport layer 950 is formed out of an oxide layer grown out of first metal layer 920 at region 951 shown in FIG. 9A.

Figure 9A:
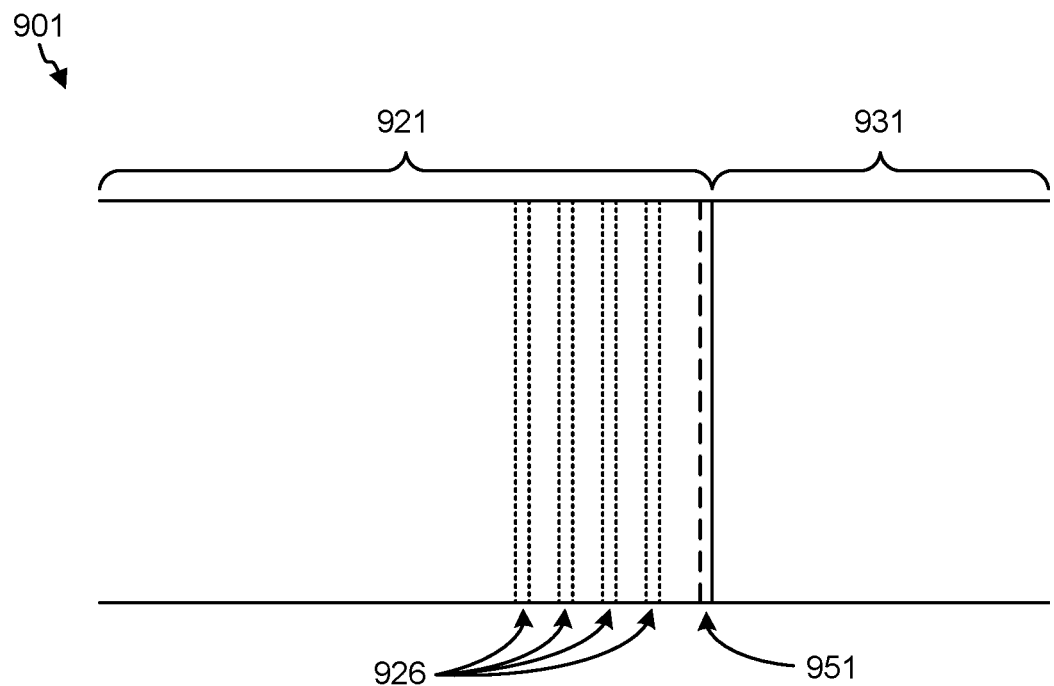
FIG. 9A provides a layout of patterns for fabricating an example plasmon injector device, in accordance with at least some embodiments.
Figure 9B:
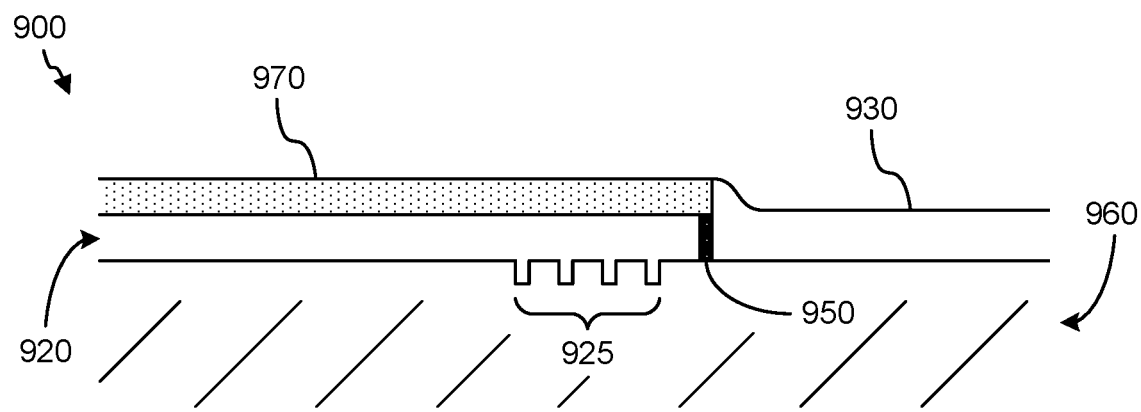
FIG. 9B provides a cross-sectional illustration of an example plasmon injector device, in accordance with at least some embodiments.

In an example, a cell comprising a plasmon injector 900 may have an area of 4 μm×10 μm, where the 4 μm is the horizontal length shown in FIG. 9A, and 10 μm is the width of the device shown in FIG. 9A. The plasmon injector device 900 can be electrically linked to those of adjacent cells to form an array comprising series and parallel combinations, as described above. For cells on a 6 μm pitch in one direction and a 12 μm pitch in the other to allow sufficient area around the active area for interconnects, there can be a total of 1.25 billion elements in an array with an overall substrate area of 30 cm×30 cm.

Metasurface. Periodic grooves in the substrate 960 will be used to form the metasurface 925. By way of example, the following steps can be used to prepare the grooves in the substrate 960.

1. Resist is spun onto the $SiO_2$ substrate 960 and soft baked.

2. Using nanoimprinting, the metasurface pattern 926 is formed in the resist.

3 Using inductively coupled plasma etching (ICP) and $C_4F_8$ gas, 30 nm deep grooves are etched into the substrate 960.

4. The remaining photoresist is cleaned off with an oxygen plasma.

First Metal Layer and Insulator. First metal layer 920 forms the plasmon Casimir cavity, and the insulator 970 prevents first the first metal layer 920 from shorting to the second metal layer 930 along the edge. By way of example, the following steps can be used to prepare first metal layer 920 and insulator 970

1. 40 nm of nickel is sputtered onto the substrate 960, filling the grooves in substrate 960 for metasurface 925 and forming a nickel structure for metal layer 920.

2. 40 nm of $SiO_2$ is sputtered over the nickel for insulator 970.

3. Negative photoresist is spun onto the nickel/$SiO_2$ layer and soft baked.

4. Using an aligner, the first metal layer pattern 921 shown in FIG. 9A is exposed, followed by a post-exposure bake, develop and rinse.

5. Using inductively coupled plasma etching (ICP) and $Cl_2$+Ar gas, the exposed nickel and $SiO_2$ is removed, leaving an exposed edge of the nickel structure.

Transport Layer. Hot electrons are transported through a thin transport layer 950 along the edge of the nickel structure used for the first metal layer 920. By way of example, the following steps can be used to prepare transport layer 950.

1. The nickel is exposed to oxygen briefly to allow a controlled growth of NiO to 3 nm on the exposed edge. The resultant NiO corresponds to transport layer 950, which is surrounded by substrate 960, first metal layer 920, and insulator 970.

Second Metal Layer. Second metal layer 930 forms the second contact to the transport layer 950. By way of example, the following steps can be used to prepare second metal layer 930.

1. 40 nm of aluminum is evaporated onto the substrate 960 and lifted off the resist-coated area with acetone, followed by isopropanol and then a water rinse, to form the second metal layer 930 according to second metal layer pattern 931.

It will be appreciated that the above description of a fabrication scheme for making plasmon injector device 900 is merely exemplary and that a variety of different dimensions, processing schemes, materials, patterns, or the like may be used by the skilled artisan to prepare a plasmon injector element.

Example Ranges of Dimensions. Although a cell size of 4 μm×10 μm is described above, other cell sizes can be used. Example cell sizes may be from 0.1 μm on an edge up to 1 cm. In some examples, the chosen size can be determined by (i) the desired output characteristics, (ii) redundancy to compensate for defective cells, and (iii) the ease of fabrication.

Regarding of the pitch of the metasurface protrusions, the pitch determines the spectral range of zero-point energy that are suppressed. For a smaller pitch, the range of suppressed modes extends to higher frequency and energy, and hence the greater the flux of plasmons and the higher the energy of the plasmons will be. It is more challenging and expensive to form smaller pitches. Pitch distances fall in the range of 10 nm to 2 μm. For the nanoimprint patterning described above, a pitch of 50 nm is appropriate.

Regarding the thickness of the first conductor and of the second conductor, since the area of the transport layer is determined by the thickness and width of the conductor layer, a thicker conductor produces a larger transport layer and hence a higher injection current and lower resistance. For a 40 nm thick conductor that is 10 μm wide, the transport layer area is 0.4 μm². For the materials described above, the resistance can be approximately 1 kΩ, which can be a useful resistance to work with. The thickness of the metal layers through which hot electrons are generated is limited to the penetration depth of the surface plasmons, which is usually below 100 nm at multi-terahertz frequencies, and so the thickness should usually be below that. A useful range of conductor thicknesses is 10 to 500 nm.

There are tradeoffs involved in the choice of transport layer thickness. The output power depends on the product of the current and the voltage, and for a given current the voltage increases with the resistance. Both current and the resistance can vary roughly exponentially with the thickness of the transport layer, and so a small change in transport layer thickness can make a large difference in both of those quantities. When the transport layer becomes too thick, the current can be drastically reduced due to a much smaller probability of electrons being injected through the material.

A compounding factor is that there may be a native oxide that has grown on the first conductive layer and adds to the overall transport layer thickness. This can be taken into account when choosing the thickness to deposit. The desired transport layer thickness can also depend upon the barrier height that the particular materials combination produces. A higher barrier increases the resistance and reduces the injection current. In some examples, the thickness of the transport layer can fall between 0.5 nm and 20 nm.

ILLUSTRATIVE ASPECTS

As used below, any reference to a series of aspects (e.g., "Aspects 1-4") or non-enumerated group of aspects (e.g., "any previous or subsequent aspect") is to be understood as a reference to each of those aspects disjunctively (e.g., "Aspects 1-4" is to be understood as "Aspects 1, 2, 3, or 4").

Aspect 1 is a device comprising: a zero-point-energy-density-reducing structure; a device component; a transport layer between and adjoining the zero-point-energy-density-reducing structure and the device component, wherein the zero-point-energy-density-reducing structure provides an asymmetry with respect to the transport layer that drives a flow of energy or particles or waves between the zero-point-energy-density-reducing structure and the device component.

Aspect 2 is the device of any previous or subsequent aspect, wherein the asymmetry produces a voltage difference between the zero-point-energy-density-reducing structure and the device component or wherein the asymmetry produces a net charge flow between the zero-point-energy-density-reducing structure and the device component.

Aspect 3 is the device of any previous or subsequent aspect, wherein the asymmetry provides a difference between a first zero-point energy density on a first side of the transport layer adjacent to the zero-point-energy-density-reducing structure and a second zero-point energy density on a second side of the transport layer adjacent to the device component that drives the flow of energy.

Aspect 4 is the device of any previous or subsequent aspect, wherein the zero-point-energy-density-reducing structure corresponds to at least a part of a first conductive layer of an electronic device, and wherein the device component corresponds to at least a part of a second conductive layer of the electronic device.

Aspect 5 is the device of any previous or subsequent aspect, wherein the transport layer permits transport of charge carriers in 1 ps or less, 100 fs or less, 10 fs or less, 1 fs or less, or 0.1 fs or less.

Aspect 6 is the device of any previous or subsequent aspect, wherein the transport layer permits capture of charge carriers that pass through the transport layer in 1 ps or less, 100 fs or less, 10 fs or less, 1 fs or less, or 0.1 fs or less.

Aspect 7 is the device of any previous or subsequent aspect, wherein the zero-point-energy-density-reducing structure comprises a plasmon Casimir cavity.

Aspect 8 is the device of any previous or subsequent aspect, wherein the zero-point-energy-density-reducing structure comprises: a first conductor, structured to limit a range of zero-point energy plasmon modes within the conductor.

Aspect 9 is the device of any previous or subsequent aspect, wherein the first conductor includes a metasurface.

Aspect 10 is the device of any previous or subsequent aspect, wherein the metasurface exhibits spatially periodic structures characterized by a pitch, wherein the pitch is from 5 nm to 1 µm.

Aspect 11 is the device of any previous or subsequent aspect, wherein the first conductor is supported by a dielectric and wherein the metasurface is positioned at an interface between the first conductor and the dielectric.

Aspect 12 is the device of any previous or subsequent aspect, wherein the first conductor is supported by a dielectric and wherein the metasurface is positioned opposite an interface between the first conductor and the dielectric.

Aspect 13 is the device of any previous or subsequent aspect, wherein the first conductor comprises a series of alternating sublayers of at least two different conductors.

Aspect 14 is the device of any previous or subsequent aspect, wherein the alternating sublayers independently have thicknesses of from 0.3 nm to 1 µm.

Aspect 15 is the device of any previous or subsequent aspect, wherein the device component comprises a second conductor, and wherein the second conductor does not comprise a plasmon Casimir cavity.

Aspect 16 is the device of any previous or subsequent aspect, comprising a Casimir plasmon injector.

Aspect 17 is the device of any previous or subsequent aspect, wherein the first conductor comprises a metal, a semiconductor, a two-dimensional conductive material, or a conductive ceramic and wherein the second conductor comprises a metal, a semiconductor, a two-dimensional conductive material, or a conductive ceramic.

Aspect 18 is the device of any previous or subsequent aspect, wherein the first conductor or the second conductor comprise a multilayer structure including a plurality of conductive sub-layers.

Aspect 19 is the device of any previous or subsequent aspect, wherein the device component comprises a semiconductor.

Aspect 20 is the device of any previous or subsequent aspect, wherein the transport layer comprises at least a portion of an accumulation region or depletion region in the semiconductor.

Aspect 21 is the device of any previous or subsequent aspect, wherein the semiconductor has a dopant concentration of from $10^{15}$ cm$^{-3}$ to $10^{21}$ cm$^{-3}$ or a subrange thereof, such as from $10^{15}$ cm$^{-3}$ to $10^{16}$ cm$^{-3}$, from $10^{16}$ cm$^{-3}$ to $10^{17}$ cm$^{-3}$, from $10^{17}$ cm$^{-3}$ to $10^{18}$ cm$^{-3}$, from $10^{18}$ cm$^{-3}$ to $10^{19}$ cm$^{-3}$, from $10^{19}$ cm$^{-3}$ to $10^{20}$ cm$^{-3}$, from $10^{20}$ cm$^{-3}$ to $10^{21}$ cm$^{-3}$.

Aspect 22 is the device of any previous or subsequent aspect, wherein the zero-point-energy-density-reducing structure, the transport layer, and the device component together comprises a diode selected from a metal/insulator/metal diode (MIM), a Schottky diode, a metal/insulator/semiconductor (MIS) diode, a Mott diode, a quantum well diode, a ballistic diode, or a carbon nanotube diode, or wherein the zero-point-energy-density-reducing structure, the transport layer, and the device component together comprises a superconductor/insulator/superconductor (SIS) device.

Aspect 23 is the device of any previous or subsequent aspect, wherein the transport layer comprises a dielectric.

Aspect 24 is the device of any previous or subsequent aspect, wherein the transport layer comprises a semiconductor.

Aspect 25 is the device of any previous or subsequent aspect, wherein a barrier height magnitude between the transport layer and one or both of the first conductor or the second conductor is from 0 eV to 10 eV.

Aspect 26 is the device of any previous or subsequent aspect, wherein the transport layer has a thickness between the zero-point-energy-density-reducing structure and the device component of from 0.3 nm to 50 nm.

Aspect 27 is the device of any previous or subsequent aspect, wherein the transport layer comprises a multilayer structure including a plurality of sub-layers.

Aspect 28 is the device of any previous or subsequent aspect, electrically connected to a load positioned to receive electric current from the zero-point-energy-density-reducing structure and the device component.

Aspect 29 is the device of any previous or subsequent aspect, wherein the zero-point-energy-density-reducing structure comprises a Casimir cavity, the device further comprising a first nanoparticle at least partially within the Casimir cavity, wherein the device component comprises a second nanoparticle electrically coupled to the first nanoparticle, and wherein the transport layer comprises a portion of the second nanoparticle.

Aspect 30 is the device of any previous or subsequent aspect, wherein the second nanoparticle is positioned outside of the Casimir cavity.

Aspect 31 is the device of any previous or subsequent aspect, wherein zero-point energy excited plasmons drive a flow of charges between the second nanoparticle and the first nanoparticle.

Aspect 32 is the device of any previous or subsequent aspect, wherein the first nanoparticle comprises a conductor, and wherein the second nanoparticle comprises a semiconductor.

Aspect 33 is the device of any previous or subsequent aspect, wherein the first nanoparticle comprises a metal, and wherein the second nanoparticle comprises a metal oxide.

Aspect 34 is the device of any previous or subsequent aspect, wherein the first nanoparticle comprises gold, and wherein the second nanoparticle comprises titanium dioxide.

Aspect 35 is the device of any previous or subsequent aspect, wherein the first nanoparticle has a cross-sectional dimension of 5 nm to 50 nm.

Aspect 36 is the device of any previous or subsequent aspect, wherein the first nanoparticle has a cross-sectional dimension of 5 nm to 100 nm.

Aspect 37 is a device array comprising: a plurality of devices of any previous or subsequent aspect arranged in an array configuration.

Aspect 38 is the device array of any previous or subsequent aspect, wherein at least a subset of the plurality of devices are arranged in a series configuration.

Aspect 39 is the device array of any previous or subsequent aspect, wherein at least a subset of the plurality of devices are arranged in a parallel configuration.

Aspect 40 is the device array of any previous or subsequent aspect, wherein the plurality of devices are arranged in a combination of series and parallel configurations.

Aspect 41 is a device stack comprising: a plurality of device layers arranged in a stacked configuration, wherein each device layer comprises one or more devices of any previous or subsequent aspect.

Aspect 42 is the device stack of any previous or subsequent aspect, wherein each device layer is positioned above and/or below another device layer.

Aspect 43 is the device stack of any previous or subsequent aspect, wherein each device layer corresponds to an array comprising a plurality of the devices.

Aspect 44 is a plasmon Casimir cavity comprising: a conductor structured to limit a range of zero-point energy plasmon modes within the conductor.

Aspect 45 is the plasmon Casimir cavity of any previous or subsequent aspect, wherein the conductor is structured by a metasurface.

Aspect 46 is the plasmon Casimir cavity of any previous or subsequent aspect, wherein the metasurface exhibits spatially periodic structures characterized by a pitch.

Aspect 47 is the plasmon Casimir cavity of any previous or subsequent aspect, wherein the pitch is from 5 nm to 1 µm.

Aspect 48 is the plasmon Casimir cavity of any previous or subsequent aspect, wherein the conductor comprises a series of alternating sublayers of at least two different conductors.

Aspect 49 is the plasmon Casimir cavity of any previous or subsequent aspect, wherein the alternating sublayers independently have thicknesses of from 0.3 nm to 1 µm.

Aspect 50 is the plasmon Casimir cavity of any previous aspect, wherein a dielectric or a semiconductor comprises at least a part of one sublayer.

REFERENCES

U.S. Pat. Nos. 7,379,286, 8,803,340, and 9,581,142.

Atar et al., 2013, "Plasmonically enhanced hot electron based photovoltaic device," Optics Express 21:6, 7196-7201.

Blandford and Thorne, 2008, "Applications of Classical Physics," Lecture Notes Chapter 6, California Institute of Technology, Version 12.

Brongersma et al. (Eds.), 2007, Surface plasmon nanophotonics (Vol. 131); Springer.

Brongersma et al., 2015, "Plasmon-induced hot carrier science and technology," Nature Nanotechnology, 10:1, 25-34.

Chalabi et al., 2014, "Hot-electron photodetection with a plasmonic nanostripe antenna," Nano Lett., 14:3, 1374-1380.

Clavero, 2014, "Plasmon induced hot-electron generation at nanoparticle/metal-oxide interfaces for photovoltaic and photocatalytic devices," Nature Photonics, 8:2, 95-103.

Du et al., 2013, "Ultrafast plasmon induced electron injection mechanism in gold-$TiO_2$ nanoparticle system." J. Photochem. and Photobiol. C: Photochem. Revs., 15, 21-30.

Gall, 2016, "Electron mean free path in elemental metals," J. Appl. Phys., 119:8, 085101.

Genet et al., 2003, "Casimir force and the quantum theory of lossy optical cavities," Phys. Rev. A., 67:4, 043811.

Gong et al., 2007, "Design of plasmonic cavities for solid-state cavity quantum electrodynamics applications," Appl. Phys. Lett., 90:3, 033113.

Helman et al., 1973, "Theory of internal photoemission," Phys. Rev. B, 7:8, 3702.

Herner et al., 2017, "High performance MIIM diode based on cobalt oxide/titanium oxide," Appl. Phys. Lett., 110, 223901.

John et al., 2017, "Optical properties of graphene, silicene, germanene, and stanene from IR to far UV—a first principles study," J. Phys. and Chem. of Solids, 110, 307-315.

Kish, 2005, "Stealth communication: Zero-power classical communication, zero-quantum quantum communication and environmental-noise communication," Appl. Phys. Lett., 87:23, 234109.

Kish et al., 2016, "Zero-point term and quantum effects in the Johnson noise of resistors: a critical appraisal," J. Stat. Mech.: Theory and Experiment, 2016:5, 054006.

Knight et al., 2013, "Embedding plasmonic nanostructure diodes enhances hot electron emission," Nano Lett., 13:4, 1687-1692.

Kodama et al., 2001, "Fast heating of ultrahigh-density plasma as a step towards laser fusion ignition," Nature, 412:6849, 798.

Lambe et al., 1976, "Light emission from inelastic electron tunneling," Phys. Rev. Lett., 37:14, 923.

Lebedev et al., 1999, "The dynamics of wire array Z-pinch implosions," Phys. of Plasmas, 6:5, 2016-2022.

McCarthy et al., 1977, "Enhancement of light emission from metal-insulator-metal tunnel junctions," Appl. Phys. Lett., 30:8, 427-429.

Mizuguchi et al., 2007, "Simulation of high-energy proton production by fast magnetosonic shock waves in pinched plasma discharges," Phys. of Plasmas, 14:3, 032704.

Moddel, G. and Dmitriyeva, O., 2019, "Extraction of Zero-Point Energy from the Vacuum: Assessment of Stochastic Electrodynamics-Based Approach as Compared to Other Methods," Atoms, 7(2), 51.

Sze et al., 2006, "Physics of semiconductor devices," John Wiley & Sons, p. 682.

van Dorp et al., 2009, "SiC: a photocathode for water splitting and hydrogen storage," Angewandte Chemie Intl. Ed., 48:33, 6085-6088

Viswanath et al., 2019, "A nanosheet phosphor of double-layered perovskite with unusual intrananosheet site activator concentration," Chem. Eng. J., 122044.

Wang et al., 2000, "Light emission from the double-barrier Al/Al$_2$O$_3$/Al/Al$_2$O$_3$/Au tunnel junction," Thin Solid Films, 371:1-2, 191-194.

Wang et al., 2011, "Plasmonic energy collection through hot carrier extraction," Nano Lett., 11:12, 5426-5430.

Wang et al., 2017, "Field-assisted splitting of pure water based on deep-sub-debye-length nanogap electrochemical cells," ACS Nano, 11:8, 8421-8428.

Walter et al., 2010, "Solar water splitting cells," Chem. Rev. 110:11, 6446-6473.

Zhu, 2014, "Graphene Geometric Diodes for Optical Rectennas," PhD Thesis, University of Colorado, 68-77.

STATEMENTS REGARDING INCORPORATION BY REFERENCE AND VARIATIONS

All references throughout this application, for example patent documents including issued or granted patents or equivalents, patent application publications, and non-patent literature documents or other source material, are hereby incorporated by reference herein, as though individually incorporated by reference.

All patents and publications mentioned in the specification are indicative of the levels of skill of those skilled in the art to which the invention pertains. References cited herein are incorporated by reference to indicate the state of the art, in some cases as of their filing date, and it is intended that this information can be employed herein, if needed, to exclude (for example, to disclaim) specific embodiments that are in the prior art.

When a group of substituents is disclosed herein, it is understood that all individual members of those groups and all subgroups and classes that can be formed using the substituents are disclosed separately. When a Markush group or other grouping is used herein, all individual members of the group and all combinations and subcombinations possible of the group are intended to be individually included in the disclosure. As used herein, "and/or" means that one, all, or any combination of items in a list separated by "and/or" are included in the list; for example "1, 2 and/or 3" is equivalent to "'1' or '2' or '3' or '1 and 2' or '1 and 3' or '2 and 3' or '1, 2 and 3'".

Every formulation or combination of components described or exemplified can be used to practice the invention, unless otherwise stated. Specific names of materials are intended to be exemplary, as it is known that one of ordinary skill in the art can name the same material differently. It will be appreciated that methods, device elements, starting materials, and synthetic methods other than those specifically exemplified can be employed in the practice of the invention without resorting to undue experimentation. All art-known functional equivalents, of any such methods, device elements, starting materials, and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A device comprising:
    a zero-point-energy-density-reducing structure;
    a device component; and
    a transport layer between and adjoining the zero-point-energy-density-reducing structure and the device component, wherein the zero-point-energy-density-reducing structure provides an asymmetry with respect to the transport layer that drives a flow of energy between the zero-point-energy-density-reducing structure and the device component.

2. The device of claim 1, wherein the asymmetry produces a net charge flow between the zero-point-energy-density-reducing structure and the device component.

3. The device of claim 1, wherein the asymmetry provides a difference between a first zero-point energy density on a first side of the transport layer adjacent to the zero-pointenergy-density-reducing structure and a second zero-point energy density on a second side of the transport layer adjacent to the device component that drives the flow of energy.

4. The device of claim 1, wherein the zero-point-energy-density-reducing structure corresponds to at least a part of a first conductive layer of an electronic device, and wherein the device component corresponds to at least a part of a second conductive layer of the electronic device.

5. The device of claim 1, wherein the transport layer permits transport of charge carriers across it in 1 ps or less.

6. The device of claim 1, wherein charge carriers that pass through the transport layer are captured in 1 ps or less.

7. The device of claim 1, wherein the zero-point-energy-density-reducing structure comprises:
a first conductor, structured to limit a range of zero-point energy plasmon modes within the first conductor.

8. The device of claim 7, wherein the first conductor includes a metasurface.

9. The device of claim 8, wherein the metasurface exhibits spatially periodic structures characterized by a pitch, wherein the pitch is from 5 nm to 1 µm.

10. The device of claim 8, wherein the first conductor is supported by a dielectric and wherein the metasurface is positioned at an interface between the first conductor and the dielectric.

11. The device of claim 8, wherein the first conductor is supported by a dielectric and wherein the metasurface is positioned opposite an interface between the first conductor and the dielectric.

12. The device of claim 7, wherein the first conductor comprises a series of alternating sublayers of at least two different conductors.

13. The device of claim 12, wherein the alternating sublayers independently have thicknesses of from 0.3 nm to 1 µm.

14. The device of claim 7, wherein the device component comprises a second conductor, and wherein the second conductor does not comprise a plasmon Casimir cavity.

15. The device of claim 14, wherein the first conductor comprises a metal and wherein the second conductor comprises a metal.

16. The device of claim 15, wherein the first conductor or the second conductor comprise a multilayer structure including a plurality of conductive sub-layers.

17. The device of claim 7, wherein the device component comprises a semiconductor.

18. The device of claim 1, wherein the zero-point-energy-density-reducing structure, the transport layer, and the device component together comprises a diode.

19. The device of claim 1, wherein the transport layer comprises a dielectric.

20. The device of claim 1, wherein the transport layer comprises a semiconductor.

21. The device of claim 1, wherein the transport layer has a thickness between the zero-point-energy-density-reducing structure and the device component of from 0.3 nm to 50 nm.

22. The device of claim 1, wherein the transport layer comprises a multilayer structure including a plurality of sub-layers.

23. The device of claim 1, electrically connected to a load positioned to receive electric current from the zero-point-energy-density-reducing structure and the device component.

24. The device of claim 1, wherein the zero-point-energy-density-reducing structure comprises a Casimir cavity,
the device further comprising a first nanoparticle at least partially within the Casimir cavity,
wherein the device component comprises a second nanoparticle electrically coupled to the first nanoparticle, and
wherein the transport layer comprises a portion of the second nanoparticle.

25. The device of claim 24, wherein the second nanoparticle is positioned outside of the Casimir cavity.

26. The device of claim 24, wherein zero-point energy excited plasmons drive a flow of charges between the second nanoparticle and the first nanoparticle.

27. The device of claim 24, wherein the first nanoparticle comprises a conductor, and wherein the second nanoparticle comprises a semiconductor.

28. A device array comprising:
a plurality of devices of claim 1 arranged in an array configuration.

29. The device array of claim 28, wherein the plurality of devices are arranged in a combination of series and parallel configurations.

30. A device stack comprising:
a plurality of device layers arranged in a stacked configuration, wherein each device layer comprises one or more devices of claim 1.

31. The device stack of claim 30, wherein each device layer corresponds to an array comprising a plurality of the devices.

32. A plasmon Casimir cavity comprising:
a conductor structured to limit a range of zero-point energy plasmon modes within the conductor.

33. The plasmon Casimir cavity of claim 32, wherein the conductor is structured by a metasurface.

34. The plasmon Casimir cavity of claim 33, wherein the metasurface exhibits spatially periodic structures characterized by a pitch, wherein the pitch is from 5 nm to 1 µm.

35. The plasmon Casimir cavity of claim 32, wherein the conductor comprises a series of alternating sublayers of at least two different conductors.

36. The plasmon Casimir cavity of claim 35, wherein the alternating sublayers independently have thicknesses of from 0.3 nm to 1 µm.

37. The plasmon Casimir cavity of claim 35, wherein a dielectric or a semiconductor comprises at least a part of one sublayer.

* * * * *